(12) United States Patent
Hawker et al.

(10) Patent No.: US 8,823,154 B2
(45) Date of Patent: Sep. 2, 2014

(54) ENCAPSULATION ARCHITECTURES FOR UTILIZING FLEXIBLE BARRIER FILMS

(75) Inventors: Craig J. Hawker, Santa Barbara, CA (US); Jimmy Granstrom, Santa Barbara, CA (US); Luis M. Campos, Santa Barbara, CA (US); Jeffrey A. Gerbec, Goleta, CA (US); Motoko Furukawa, Goleta, CA (US)

(73) Assignee: The Regents of The University of California, Santa Barbara, CA (US)

( * ) Notice: Subject to any disclaimer, the term of this patent is extended or adjusted under 35 U.S.C. 154(b) by 889 days.

(21) Appl. No.: 12/800,098

(22) Filed: May 7, 2010

(65) Prior Publication Data

US 2011/0062603 A1    Mar. 17, 2011

Related U.S. Application Data

(60) Provisional application No. 61/215,692, filed on May 8, 2009.

(51) Int. Cl.
    *H01L 23/20*    (2006.01)
(52) U.S. Cl.
    USPC .................................. 257/682; 257/E23.138
(58) Field of Classification Search
    None
    See application file for complete search history.

(56) References Cited

U.S. PATENT DOCUMENTS

| | | | |
|---|---|---|---|
| 5,200,237 A | 4/1993 | Sugama | |
| 5,407,713 A | 4/1995 | Wilfong et al. | |
| 5,491,023 A | 2/1996 | Tsai et al. | |
| 5,496,295 A | 3/1996 | Wilfong et al. | |
| 5,643,375 A | 7/1997 | Wilfong et al. | |
| 5,668,203 A | 9/1997 | Badesha et al. | |
| 5,670,583 A | 9/1997 | Wellinghoff | |
| 5,730,919 A | 3/1998 | Wilfong et al. | |
| 5,783,269 A | 7/1998 | Heilmann et al. | |
| 5,983,604 A | 11/1999 | Wilfong et al. | |
| 5,989,725 A | 11/1999 | Bullard et al. | |
| 6,037,063 A | 3/2000 | Muschiatti et al. | |
| 6,096,437 A | 8/2000 | Soucek et al. | |
| 6,465,953 B1 * | 10/2002 | Duggal | 313/553 |
| 6,497,598 B2 | 12/2002 | Affinito | |

(Continued)

FOREIGN PATENT DOCUMENTS

| | | |
|---|---|---|
| EP | 0617665 B1 | 3/1999 |
| EP | 1650020 A1 | 4/2006 |

(Continued)

OTHER PUBLICATIONS

Sanchez et al., "Applications of hybrid organic-inorganic nanocomposites," Journal of Materials Chemistry, 2005, vol. 15, p. 3559-3592.*

(Continued)

*Primary Examiner* — Michael Lebentritt
*Assistant Examiner* — Kevin Quinto
(74) *Attorney, Agent, or Firm* — Gates & Cooper LLP

(57) ABSTRACT

An article and method of using spacer layer regions is provided, containing a gas compound, to reduce gas permeation through barrier films overlying a substrate comprising creating a spacer layer between one or more of the barrier films, wherein the spacer layer comprises at least one inert gaseous compound. In another embodiment, an article and method is provided comprising creating alternating thin films of hybridized sol-gel spin-on glass and PDMS based and olefin based elastomers.

29 Claims, 24 Drawing Sheets

(56) References Cited

U.S. PATENT DOCUMENTS

| | | | |
|---|---|---|---|
| 6,506,461 B2 | 1/2003 | Affinito | |
| 6,570,325 B2 | 5/2003 | Graff et al. | |
| 6,866,901 B2 | 3/2005 | Burrows et al. | |
| 6,962,671 B2 | 11/2005 | Martin et al. | |
| 7,198,832 B2 | 4/2007 | Burrows et al. | |
| 7,288,315 B2 | 10/2007 | Yoshida et al. | |
| 2001/0020738 A1* | 9/2001 | Iizima et al. | 257/680 |
| 2003/0203210 A1 | 10/2003 | Graff et al. | |
| 2004/0097675 A1* | 5/2004 | Ameduri et al. | 526/247 |
| 2004/0238846 A1* | 12/2004 | Wittmann et al. | 257/200 |
| 2005/0022697 A1* | 2/2005 | Benrashid et al. | 106/287.13 |
| 2005/0064681 A1* | 3/2005 | Wood et al. | 438/459 |
| 2005/0104032 A1* | 5/2005 | Cho et al. | 252/181.1 |
| 2005/0179373 A1* | 8/2005 | Kobayashi | 313/506 |
| 2006/0225783 A1 | 10/2006 | Iwanaga | |
| 2006/0226517 A1 | 10/2006 | Iwanaga et al. | |
| 2006/0232735 A1 | 10/2006 | Hokazono et al. | |
| 2006/0251905 A1 | 11/2006 | Arakawa | |
| 2007/0026243 A1 | 2/2007 | Iwanaga et al. | |
| 2007/0049155 A1* | 3/2007 | Moro et al. | 445/24 |
| 2007/0071982 A1 | 3/2007 | Okawara et al. | |
| 2007/0092717 A1 | 4/2007 | Yoshida et al. | |
| 2007/0196682 A1* | 8/2007 | Visser et al. | 428/594 |
| 2007/0212802 A1* | 9/2007 | Lee et al. | 438/22 |
| 2007/0281174 A1 | 12/2007 | Moro et al. | |
| 2008/0093728 A1* | 4/2008 | Mahler et al. | 257/701 |
| 2008/0254266 A1 | 10/2008 | Hachisuka et al. | |
| 2010/0072565 A1* | 3/2010 | Liu et al. | 257/417 |

FOREIGN PATENT DOCUMENTS

| | | |
|---|---|---|
| EP | 1688246 A1 | 8/2006 |
| EP | 1712349 A1 | 10/2006 |
| EP | 1736308 A1 | 12/2006 |
| EP | 1787796 A1 | 5/2007 |
| EP | 1927465 A1 | 6/2008 |
| EP | 1941993 A1 | 7/2008 |
| JP | 2003-226743 | 8/2003 |
| WO | WO93/11938 | 6/1993 |
| WO | WO95/34396 | 12/1995 |
| WO | WO03/028903 A3 | 4/2003 |
| WO | WO03/094256 A3 | 11/2003 |
| WO | WO2005/100014 A1 | 10/2005 |
| WO | WO2006/019083 A1 | 2/2006 |
| WO | WO2006/055409 A3 | 5/2006 |
| WO | WO2006/120390 A2 | 11/2006 |
| WO | WO2007/013303 A1 | 2/2007 |
| WO | WO2007/034773 A1 | 3/2007 |
| WO | WO2007/069704 A1 | 6/2007 |
| WO | WO2007/119825 A1 | 10/2007 |
| WO | WO2008/059925 | 5/2008 |
| WO | WO2008/094352 A1 | 8/2008 |

OTHER PUBLICATIONS

Yen Wei, et al, Chemistry of Materials, vol. 2, No. 4, Jul./Aug. 1990, pp. 337-339 Synthesis of New Organic-Inorganic Hybrid Glasses.
Chin-Lung Chiang, et al., European Polymer Journal 38 (2002) 2219-2224, "Synthesis, characterization and thermal properties of novel epoxy . . . ".
Dong-Sing Wuu, et al., Chemical Vapor Deposition 2006, 12, 220-224, "Transparent Barrier Coatings for Flexible Organic Light-Emitting Diode Applications".
Anna B. Wojcik, et al. Applied Organometallic Chemistry, vol. 11, 129-135 (1997) "Transparent Organic/Inorganic Hybrid Gels: A Classification Scheme".
Gaurav Saini, et al. J. Vac. Sci. Technol. A26(5), Sep./Oct. 2008, 1124-1234. "Two-silane chemical vapor deposition treatment of polymer (nylon) and oxide surfaces that yields hydrophobic (and superhydrophobic), abrasion-resistant thin films".
Patrick W. Hoffmann, et al., Langmuir 1997, 13 (7), 1877-1880, "Vapor Phase Self-Assembly of Fluorinated Monolayers on Silicon and Germanium Oxide".
Merkel Science, 2002, vol. 296, No. 5567, pp. 519-522.
J.G. Wijmans, R. W. Baker, Journal of Membrane Science 107 (1995), 1-21, "The solution-diffusion model: a review".
J. Granstrom, et al., *Encapsulation of organic light-emitting devices using a perfluorinated polymer*, Appl. Phys. Lett., 2008, 93, 193304.
Lange, J., Wyser, Y.; Recent innovations in barrier technologies for plastic packaging—a review, *Packaging Technology and Science*, vol. 16, issue 4, 149-158, 2003.
Haas, K.H.; Hybrid Inorganic-Organic Polymers Based on Organically Modified Si-Alkoxides, *Advanced Engineering Materials*, vol. 2, issue 9, 571-582, 2000.
Wen, J., Wilkes, G.L.; Organic/Inorganic Hybrid Network Materials by the Sol-Gel Approach, *Chemistry of Materials*, vol. 8, issue 8, 1667-1681, 1996.
Wojcik A. B. , Schuster K., Kobelke J., Michels C., Rose K., Matthewson M.J.; Novel Hybrid Glass Protective Coatings for High Temperature Applications, Proc. 54th Int. Wire & Cable Symp, 2005.
G.L. Graff, R.E. Williford, P.E. Burrows, Mechanisms of vapor permeation through multi-layer barrier films: lag time versus equilibrium permeation, J. Appl. Phys.
Clement Sanchez, et al.; J. Mater. Chem., 2005, 15, "Applications of hybrid organic-inorganic nanocomposites", pp. 3559-3592.
Satu Ek, et al., Langmuir 2003, 19 "Atomic Layer Deposition of a High-Density Aminopropylsiloxane . . . " pp. 10601-10609.
Hao-Hsin Huang, et al., Polymer bulletin 14, 557-564 (1985), *Ceramers : Hybrid Materials Incorporating Polymeric/ Oligomeric . . . <<*.
A. S. da Silva Sobrinho, et al. J. Vac. Sci. Technol. A 18(1), Jan./Feb. 2000, pp. 149-157, "Defect-permeation correlation for ultrathin transparent . . . ".
Yves Leterrier, Progress in Materials Science 48 (2003) 1-55, "Durability of nanosized oxygen-barrier coatings on polymers".
Christoph Lungenschmied, et al, Photonics for Solar Energy Systems, vol. 6197 (2006), 619712-1 to 619712-8, "Flexible Encapsulation for Organic Solar Cells".
A. P. Roberts, et al., Journal of Membrane Science 208 (2002) 75-88, "Gas permeation in silicon-oxide/polymer (SiOx/PET) barrier films: . . . ".
Woo-Sik Jang, et al., Thin Solid Films 516 (2008) 4819-4825, "Layer-by-layer assembly of thin film oxygen barrier".
Tetsuro Jin, et al, Journal of Non-Crystalline Solids 223 (1998) 123-132, "Luminescence properties of lanthanide complexes incorporated in to sol-gel . . . ".
Sofian M. Kanan, et al., Langmuir, 2002, 18 (17) 6623-6627, "Method to Double the Surface Concentration and Control the Orientation of Adsorbed . . . ".
C. J. Huang, et al. Journal of Electronic Materials, vol. 32, No. 6 2003, pp. 478-482, "Optimization of Pretreatment for Liquid-Phase Deposition . . . ".
Helmet Schmidt, et al., Journal of Non-Crystalline Solids 121 (1990) 428-435, "Organically Modified Ceramics and their Applications".
T. C. Chang, et al., Journal of Polymer Science, vol. 38, 1972-1980 (2000), "Organic-Inorganic Hybrid Materials. v. Dynamics and Degradation . . . ".
Chris Hodson, UCSB, Oxford Instruments 2009, "On overview of thermal and plasma ALD of oxides, nitrides and metals".
Myeon-Cheon Choi, et al., Prog. Polym. Sci. 33 (2008) 581-630, "Polymers for flexible displays: From material selection to device applications".
Massimo Guglielmi, et al., Applied Organometallic Chemistry 13, 339-351 (1999), "Poly(organophosphazene)s and the Sol-gel Technique".
Raymond H. Glaser, et al., Polymer bulletin 19, 51-57 (1988), "Structure property behavior of polydimethylsiloxane and poly(tetramethylene oxide) . . . ".
John A. Howarter, et al., Macromolecules, 2007, 40 (4), 1128-1132, "Surface Modification of Polymers with 3-Aminopropyltriethoxysilane as a General Pretreatment . . . ".

(56) References Cited

OTHER PUBLICATIONS

Mei Cai, et al., Langmuir, 2000, 16(7) 3446-3453, "Surface Vibrational Spectroscopy of Alkylsilane Layers Covalently Bonded to Monolayers of . . . ".
F. W. Greenlaw, W. D. Prince, R. A. Prince and E. V. Thompson, The effect of diffusive permeation rates by upstream and downstream pressures, J. Membrane Sci., 2 (1977) 141.
N. McKeown, Angew. Towards Polymer-Based Hydrogen Storage Materials, Che. Int. Ed 2006, 45, 1804-1807.
Matteucci, S.; Kusuma, V. A.; Swinnea, S.; Freeman, B. D., Gas permeability and diffusivity in 1,2-polybutadiene containing brookite nanoparticles, Polymer, 49, 3, 757 (2008).
Campos, L., Killops, K., Sakai, R., Paulusse, J.M., Damiron, D., Drockenmuller, E., Messmore, B., Hawker, C.J,; Development of thermal and photochemical strategies for thiol-ene click polymer functionalization, *Macromolecules*, vol. 41, issue 19, 7063-7070, 2008.
Hoyle, C.E., Lee,T.Y., Roper, T.; Thiol-enes: Chemistry of the past with promise for the future, *Journal of polymer science part A: Polymer Chemistry*, vol. 42, issue 21, 5301-5338, 2004.
W. J. Jackson Jr, J. R. Caldwell,; Antiplasticization. II. Characteristics of Antiplasticizers, *Journal of Applied Polymer Science*, vol. 11, 211-226, 1967.
S. E. Vidotti, A. C. Chinellato, L. A. Pessan,; Effects of antiplasticization on the thermal, volumetrics, and transport properties of polyethersulfone, *Journal of Applied Polymer Science*, vol. 103, 2627, 2007.
L. M. Robeson; The effect of antiplasticization on the secondary loss transitions and permeability of polymers, *Polymer Engineering and Science*, vol. 9, 277-281, 1969.
A. S. da Silva Sobrinho, A study of defects in ultra-thin transparent coatings on polymers, 1999 Elsevier Science SA., pp. 1204-1210.
I. A. David, et al; Chem. Mater. 1995; An Organic/Inorganic Single-Phase Composite, pp. 1957-1967.
D. Levy, Sol-gel glasses for optics and electro-optics, 509-517.

\* cited by examiner (a)

(b)

(a)

(b)

ENCAPSULATION ARCHITECTURES FOR UTILIZING FLEXIBLE BARRIER FILMS

CROSS-REFERENCE TO RELATED APPLICATIONS

This application claims the benefit of U.S. Provisional Patent Application No. 61/215,692 filed May 8, 2009, which is hereby incorporated by reference in its entirety.

FIELD OF THE INVENTION

The invention relates to compositions and processes for multifunctional composite encapsulating films. More particularly, the invention relates to the use of gas layers between encapsulating components.

BACKGROUND OF THE INVENTION

As flexible organic electronic devices become more of a commodity, the need for multifunctional composite encapsulating films has risen sharply. The form factor of these next generation devices are offering new challenges in packaging and barrier film technology. A typical flexible organic light emitting diode (OLED) display is on the order of several hundred microns in thickness. Considering that the organic active component of the OLED readily deteriorates with trace amounts of water and/or oxygen, highly robust, optically transparent, flexible films are required to hermetically seal the device from the ambient atmosphere containing water and oxygen.

Permeation of gases through a barrier is governed by both sorption into and diffusion through the barrier matrix. It has been firmly established that permeation of heavy gases is a diffusion-controlled process while diffusion of light gases, such as $O_2$ and $H_2O$, is a sorption-controlled process[1] due to the high vapor pressure of light gases[2]. It is therefore of outmost interest to reduce both sorption into and diffusion through the polymer matrix. Water-repelling barriers, e.g. perfluorinated polymers[3] may be used to reduce the sorption into the polymer matrix.

Ceramic glass has been the mainstay for hermetic sealing of electronically sensitive devices which require an "absolute" barrier from the ambient environment. The limitation is that the typical inorganic glasses do not have elastomeric character leading to flexible, ultra thin mechanically stable structures. The ideal material would have the absolute gas barrier characteristics of ceramic glass with the proccessability and formability of a room temperature liquid solution which cures well below the working temperature of ceramic glass, typically between 800 and 1100° C. for standard borosilicates.

Recent work has been devoted to formulating such materials. These materials are commonly known as ORMOCERS[4a,b], CERAMERS[5], and Hybrid Glass[6], sometimes called spin-on glass. These materials impart the physical properties of ceramic glass, i.e. high temperature durability, robust mechanical properties and chemical resistance which can be manipulated and handled as room temperature liquids or viscous slurry prior to cross-linking or curing. After cross-linking, the material has enhanced heat resistance rising from the oxide network and shows flexibility resulting from the covalent organic moieties or intercalated organic network.

If such a material were available for mass production today, a single layer deposition would not be enough to ensure hermetic sealing. The reason being is process variances and substrate inhomogeneity induced defects. Combining these two critical parameters in high throughput processing has revealed defects ranging from the nanometer to the micron scale[7a-d]. The defects, depending on their proximity per unit area to one another, will negatively influence the mass transfer, or transmission, of ambient gas inward toward the active layer of the device. Therefore, multiple layers of an active barrier material must be deposited to effectively increase the diffusion path length of the gas. It has been shown that buffering the active barrier material between polymer layers is effective to minimize the effect of deposition process induced defects by sufficiently increasing the diffusion path length. A sufficiently long diffusion path length will reach equilibrium, or steady state, conditions before the active layer of the device is impeded.

A typical architecture of commercial barrier films are alternating layers of amorphous inorganic networks like silicon dioxide or silicon oxynitride between acrylic polymer films on a polyester substrate. These materials are successively sputtered by high vacuum processes. The polymeric layer is deposited between the amorphous inorganic films producing a series of alternating layers called dyads. A film can consist of one or many dyads depending on the desired permeation rate of water and/or oxygen.

Prior art approaches to solving the sorption-diffusion problem have included using, Mitsubishi Plastics'[8a-i] Xbarrier™, and Thin Film Inorganics on PET such as Barix™ by Vitex Systems, Inc[7b-d].

BRIEF SUMMARY OF THE INVENTION

We present a novel encapsulation architecture, wherein in some embodiments utilizing spacer layers, which enables the use of barriers layers/films to obtain high performance encapsulations. The use of spacer layers with inert gas, e.g. $N_2$, between intermittent barrier layers has two primary functions: introduction of additional gas/solid sorption barriers for light permeants, e.g. $O_2$ and $H_2O$, and delay of permeation equilibrium through chemical potential gradients across the $N_2$ spacers. The use of gas fill is well-known for sound reduction and energy conservation applications, e.g. double-pane windows. However, it has not—to the best of our knowledge—been demonstrated for applications aimed at reducing gas permeation through barrier films The PET/inert gas architectures are fabricated by applying an epoxy liquid resin around the edges of a PET film. The PET/epoxy film is then used as an encapsulation architecture for a sample, e.g. a Ca film for barrier performance evaluation, or a device, e.g. an organic light-emitting diode (OLED) or an organic photovoltaic (OPV) cell. The PET/epoxy film is attached to the sample or device and then cured by a UV laser with a wavelength of 365 nm (Keyence UV-400) for approximately 20 seconds per cm on each side of the epoxy seal. This process is repeated for any subsequently deposited PET/epoxy films attached on underlying PET/epoxy films.

The epoxy seal may be applied by hand but should preferably be applied by a machine to guarantee an automated and precise deposition of an epoxy seal with a well-defined width and thickness, which define the size of the gap filled with inert gas. Although not wishing to be bound by theory, there is a possibility that the size of the gap may be relevant for the chemical potential gradients across the multi-sorption encapsulation, since the size of the gap determines the ratios of $O_2:N_2$ and $H_2O:N_2$ within the gas-phase spacer. A large gap size may mean that it will take a longer time for enough $O_2$ and $H_2O$ species to permeate into the gas pocket prior to the establishment of the critical $O_2:N_2$ and $H_2O:N_2$ ratios required to initiate a driving force for steady state permeation through the PET/inert gas architecture(s). However, a small gap size may mean the opposite—the critical $O_2:N_2$ and $H_2O:N_2$ ratios will be established faster leading to a quicker on-set of steady state permeation. However, for a sufficiently small gap size, the number of $O_2$ and $H_2O$ species in the gas pocket may not be sufficient to initiate (steady) state permeation through the PET/inert gas architecture(s) at all.

Provided is a method of making barrier films that do not require vacuum processing. This invention describes methods and architectures related to fabrication of flexible, transparent composite multilayered thin films by room temperature solution deposition for packaging of organic electronic devices. The composite architecture was designed specifically to address the need for alternative methods of fabrication of functional films at ambient pressure and near room temperature conditions.

The use of PET/inert gas architectures and hybridized spin-on glass films between elastomeric PDMS based polymer networks are shown. The composite films show superior flexibility without inducing damage to discrete elastomeric or glass bulk region or interfaces. The hybridized spin-on glass resins where chosen for their ambient air and temperature stability. Curing is induced by heating to various temperatures for a set period of time by hot plate, remote IR or forced air convection. The temperature ramp and soak time are dependent on film thickness and desired film quality. PET/inert gas architectures were fabricated in nitrogen filled glove box with UV curable epoxy.

Suitable elastomeric materials identified were a fluorinated PDMS quick set resin and thiol-ene based PDMS photocureable elastomers. In the case of the thiol-ene based resins, specific formulations were developed for rapid and easy cure, thin film adhesion, high temperature durability and film forming quality. The fluorinated PDMS resin was used as supplied.

The respective material in liquid resin form is diluted to an appropriate viscosity with typical organic thinners. The deposition process is conducted at ambient pressure and temperature owing to precursor material stability. The resin is spun coated, drawn, wire bar coated or dip coated on various polyester films and cured. Subsequent deposition steps are carried out until the desired combination of films and composite architecture is achieved. Composite films were effectively screened by calculating the relative permeation rate of water by observing the decomposition of encapsulated Ca films. The Ca films were encapsulated with an epoxy in a nitrogen filled glove box and exposed to high humidity in an environmental chamber.

A method of using spacer regions is provided, containing a gas compound, to reduce gas permeation through encapsulation components overlying a substrate comprising creating a spacer layer between one or more of the encapsulation components, wherein the spacer layer comprises at least one inert gaseous compound.

In a more particular embodiment of the method of using spacer regions, wherein the encapsulation components comprise barrier films comprising one or more alternating layers of hybridized sol-gel spin-on glass and PDMS based and olefin based elastomers.

In yet another embodiment, an article is provided comprising a substrate, a sample overlying the substrate, a first barrier layer overlying the sample; and a second barrier layer overlying the first barrier layer. In a more particularized embodiment, said article further comprises a spacer layer between the first and second barrier layers, wherein the spacer layer comprises a gaseous compound.

In another embodiment, an article is provided comprising a substrate, a sample overlying the substrate, a first barrier layer overlying the sample; and a second barrier layer overlying the first barrier layer, wherein the first layer comprises a hybridized spin-on glass and the second layer comprises PDMS based elastomers.

A method is also provided of producing composite multilayered thin films comprising depositing a layer of a first barrier film onto a sample; and depositing a layer of a second barrier film onto said first barrier film layer; wherein deposition of first and second barrier films are performed at ambient pressures and temperatures without vacuum processing.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
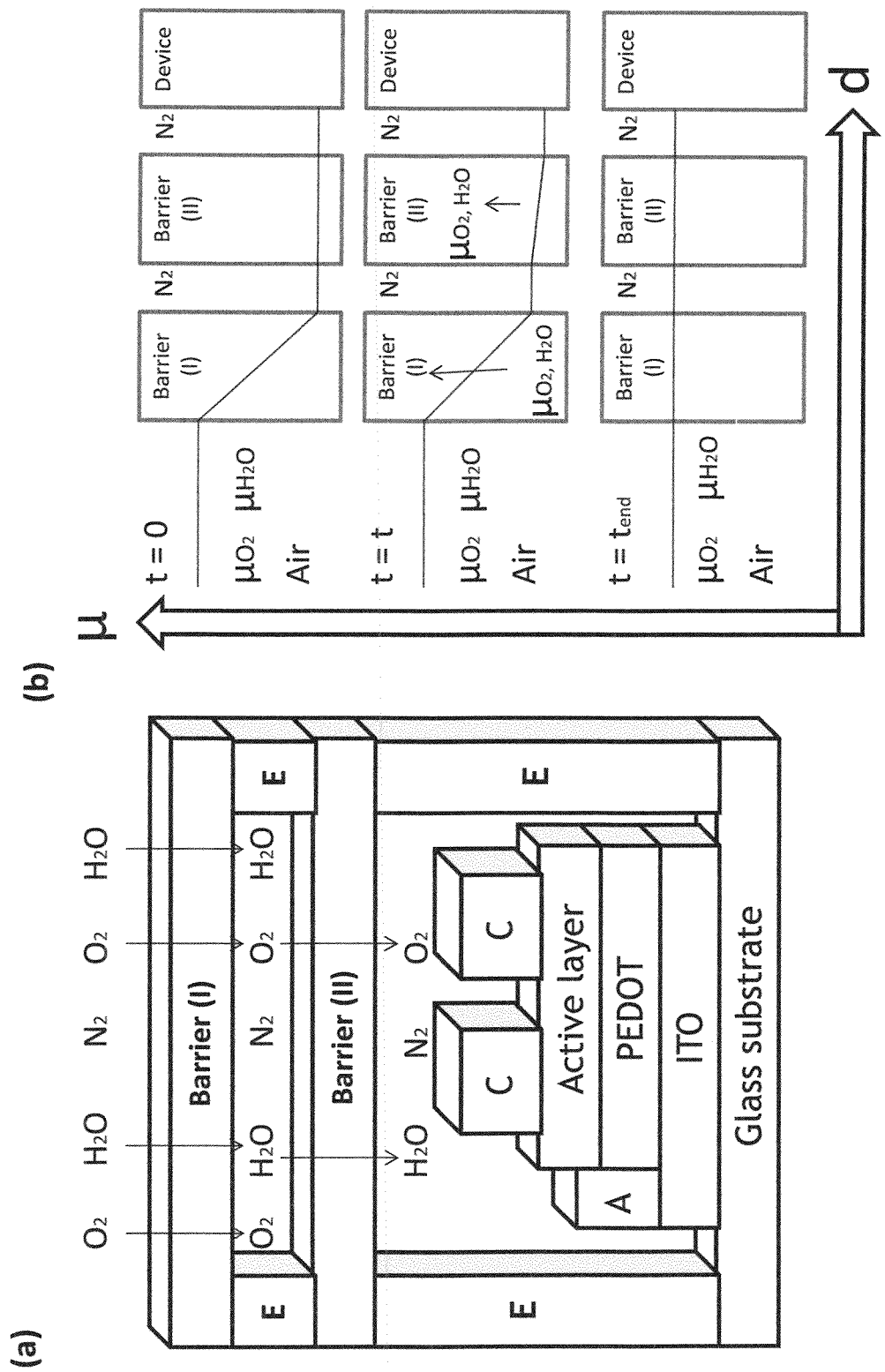
FIG. 1 shows a) a schematic depicting an organic electronic device encapsulated with nitrogen gas phase spacers between free-standing barrier films (marked with /// in the figure). E is an encapsulating epoxy (marked with \\\ in the figure), C is a cathode and A is an anode and b) a depiction of the equilibrium delay in an encapsulation architecture utilizing nitrogen gas-phase spacers between free-standing barrier films. The y axis denotes the chemical potential ($\mu$) while the x axis denotes the permeation distance (d).

Encapsulation components are herein defined as components used for encapsulation of electronic devices, such as water getters such as barium oxide, zinc oxide, boron oxide, and magnesium oxide etc.; nitrogen gas, barrier films/layers; epoxy resins or adhesives used to seal such barriers to structures.

The barrier films/layers used in this invention can be 'free-standing' or 'non-free standing'. "Free standing barriers" are a general term meaning an "as supplied" film to perform the function of slowing the transmission rate of water, oxygen etc. The "as supplied" film can be a composite of many different films of various materials together or just one material by itself like biaxially oriented PET or PVC for example. Poly(imide) (PI) is also another example of a free standing film.

Examples of non-free standing barrier films that can be used are, but not limited to, polymers such as polymethylmethacrylate and Cytop™, nanoparticles, clay and sol-gel metal oxides, e.g. TiOx, titania, zirconia, ceria, barium titanate.

One skilled in the art will realize non-free standing barriers can be incorporated into gas spacer architectures comprised of free standing barrier films described herein. Prior to free standing barrier encapsulation, a native device would be subjected to a coating of nanoparticles comprised of but not limited to polyolefins like Arton™, clay, graphene, group II oxides, group III oxides, group IV oxides, group V oxides, group VII oxides, group XIII oxides, silicon dioxide, germanium dioxide and antimony pentoxide. A coating processes not limited to spray, inkjet printing, roll-to-roll, draw bar, doctor bar, spin and dip coating can deposit sufficiently thin and uniform films. In the case of nanoparticles, their close-packed orientation creates an additional treacherous pathway in which water vapor must traverse further delaying water transmission rates. Furthermore, many of the oxides named act as desiccants or getters which additionally enhances the delay in water vapor transmission rate.

Alternatively, non-free standing barriers can be coated on free standing barriers in various stages of constructing the encapsulation architecture, either independent of the encapsulation or during the encapsulation process itself. An example of an independent process, prior to constructing the encapsulation architecture, one can apply a non-free standing barrier on a free standing barrier on one or both sides using the coating methods and materials described above. Subsequently, during the encapsulation process the non-free standing barrier can either be oriented in toward the device or on the side oriented outward to the environment. An example of an integrated process is a non-free standing barrier is coated on a free standing barrier after it has encapsulated the device either before the final free standing barrier is applied or after the final free standing barrier is applied or both.

Non-free standing barriers can also be deposited directly on a a a device or on a glass substrate using similar procedures.

Permeation through a barrier film is primarily described by the solution-diffusion model, in which permeants dissolve in the barrier material and then diffuse through the membrane down a concentration gradient. The starting point for the mathematical description of permeation in all barrier films is the proposition, solidly based in thermodynamics, that the driving forces of pressure, temperature, concentration, and electromotive force are interrelated and that the overall driving force producing movement of a permeant is the gradient in its chemical potential. Thus, the flux, $J_i$, of a component, i, is described by the simple equation:

$$J_i = -L_i \frac{d\mu_i}{dx} \qquad (3)$$

where d$\mu_i$/dx is the gradient in chemical potential of component i and $L_i$ is a coefficient of proportionality (not necessarily constant) linking this chemical potential driving force with flux[9]. All the common driving forces, such as gradients in concentration, pressure, temperature, and electromotive force, can be reduced to chemical potential gradients, and their effect on flux expressed by this equation. There is a large driving force for permeation of $O_2$ and $H_2O$ through a barrier placed in air, thus, it is desirable to develop an encapsulation architecture which gradually reduces the driving force for permeation and reduces the total cost of the encapsulation materials and process.

Permeation of gases through a barrier is characterized by the equation for the solution-diffusion model:

$$P = D \cdot S$$

where P=permeability, D=diffusion coefficient and S=sorption.

Permeability can also be expressed as:

$$P = \frac{D_i \cdot \gamma_i}{\gamma_{i(m)} \cdot p_{isat}}$$

where P=permeability, $D_i$=diffusion coefficient of the medium i, $\gamma_i$, is the solvent activity of medium i, $\gamma_{i(m)}$ is the solvent activity of a reference medium and $p_{isat}$ is the saturation vapor pressure.

Permeation of gases through polymeric barriers is frequently described by the "solution-diffusion model"[1,2] in which gas molecules dissolve in the barrier and then diffuse through a concentration gradient through the barrier. The total permeation rate is influenced by both the diffusion- and sorption properties of the permeant in the barrier. The rate of diffusion within the barrier is described by the diffusion coefficient. Sorption onto the barrier is generally assumed to occur rapidly enough to be in approximate equilibrium with the gas phase; the sorption isotherm controls the amount of upstream permeant that enters the barrier.[1,2]

The solution-diffusion equation above is not commonly used for gas-phase permeability, but it is interesting because it shows that large permeability coefficients are obtained for compounds with a large diffusion coefficient ($D_i$), a limited affinity for the gas phase (high $\gamma_i$), a high affinity for the barrier material (small $\gamma_{i(m)}$), and a low saturation vapor pressure ($P_{isat}$). This equation is also a useful way of rationalizing the effect of molecular weight on permeability. The permeant's saturation vapor pressure $p_{isat}$ and diffusion coefficient both decrease with increasing molecular weight creating competing effects on the permeability coefficient. In glassy polymers, the decrease in diffusion coefficient far outweighs other effects, and permeabilities fall significantly as molecular weight increases[10]. In rubbery polymers; on the other hand, the two effects are more balanced. For molecular weights up to 100, permeability generally increases with increasing molecular weight because $p_{isat}$ is the dominant term. Above molecular weight 100, the molecular weight gradually becomes dominant, and permeabilities fall with increasing molecular weight of the permeant. However, sorption onto the barrier is generally assumed to occur rapidly enough to be in approximate equilibrium with the gas phase; the sorption isotherm controls the amount of upstream permeant that enters the barrier[1,2]. This may not necessarily be the case for barriers encapsulated with a nitrogen spacer, though, since the partial pressure will vary in the nitrogen spacer during the transient regime, and possibly also the steady-state regime, although a possible mechanism for this effect is not known at this time. When a barrier shielding a downstream sink is exposed to an upstream permeant source, there is initially a transient process during which permeant begins to accumulate in the barrier; eventually, a steady-state concentration profile and permeation rate is reached. Limiting permeation during either of these regimes will increase device lifetime. At constant temperature and pressure, sorption and diffusion properties are fixed by the barrier material; use of low-sorption materials, such as the hydrophobic perfluorinated polymer Cytop™, has been shown to significantly improve OLED device lifetime.[3] The barrier thickness also controls permeation rate during both transient and steady regimes; at steady-state, the permeation rate is inversely proportional to the barrier thickness. However, increasing barrier thickness necessarily increases encapsulation cost; an alternative encapsulation architecture that increases device lifetime without additional cost is highly desirable.

One avenue towards this goal is the insertion of contaminant-free (e.g. pure $N_2$) gas-phase spacers between free-standing barrier films in a multilayer structure, as illustrated in FIG. 1(a), where E is an encapsulating epoxy, μ is the chemical potential and d is the permeation distance. The spacers themselves do not exhibit any barrier properties (diffusion of gas permeants in a gas phase is orders of magnitude faster than in a solid), but they act as sinks for incoming permeant, delaying the attainment of steady state. This sink action also reduces the chemical potential gradient across downstream barrier layers during the transient regime, reducing permeation rate to the device, as illustrated in FIG. 1(b). Furthermore, if sorption is not fully equilibrated and introduces a kinetic barrier to transport, the additional sorption and desorption steps needed for permeant to reach the device may also slow the steady-state permeation rate.

Figure 2:
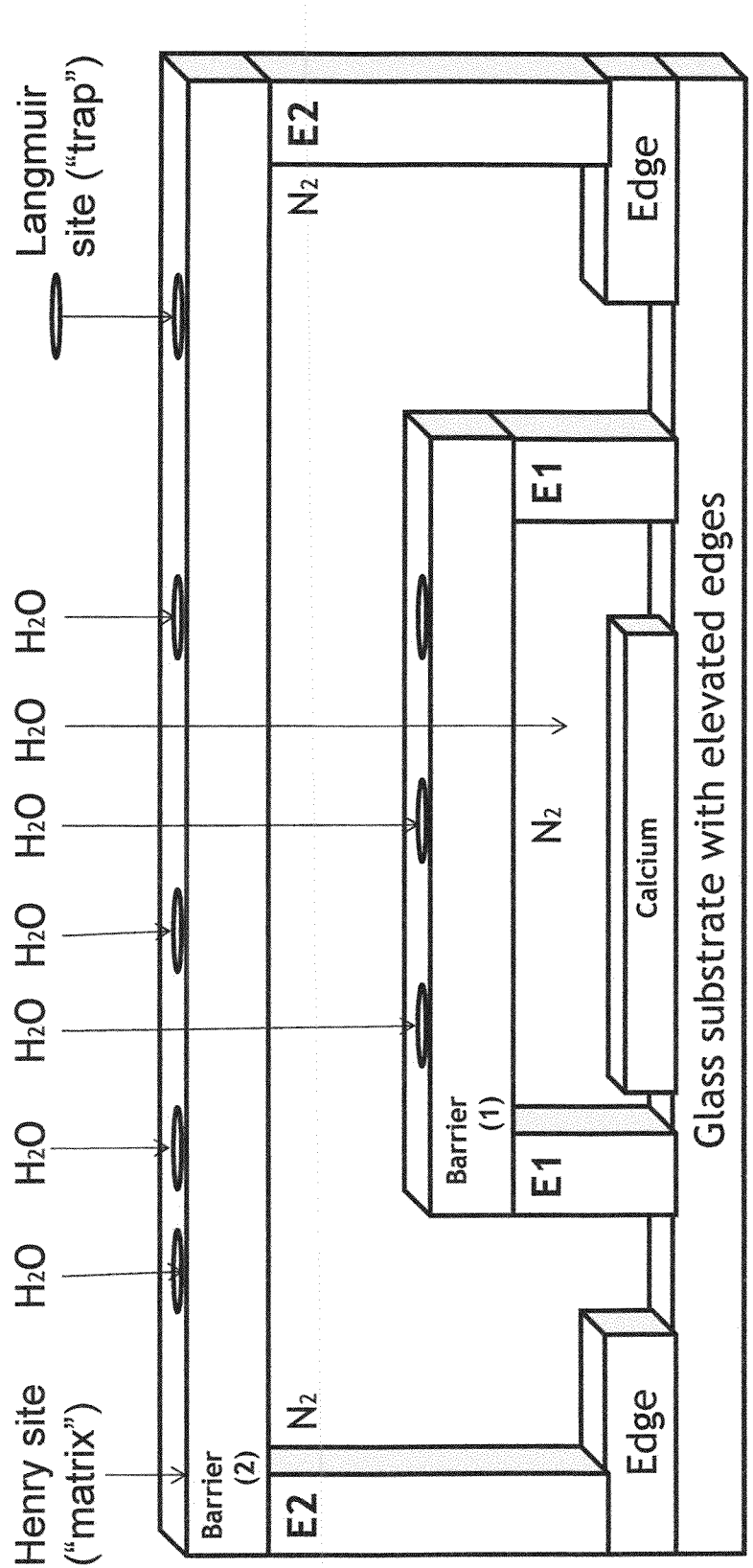
FIG. 2 shows a schematic depicting a calcium thin film encapsulated with two free-standing barrier films (separated by an nitrogen spacer) exhibiting a hypothetical distribution of Henry- and Langmuir sorption (surface) sites. The free-standing barrier films are marked with /// in the figure, while the epoxy seals marked with \\\ and the glass substrate is marked with horizontal lines. E1 denotes an epoxy seal attaching barrier (1) to the substrate and E2 denotes an epoxy seal attaching barrier (2) to barrier (1).

Gas-phase spacers may also increase the importance of Langmuir-dominated permeation at initially low partial pressures during the transient regime (and possibly also the steady-state regime, although not limited by theory), see FIG. 2. Permeation through glassy polymers, e.g. poly ethylene terephthalate (PET), is generally described by the dual-mode model or partial-immobilization model, which is characterized by absorption into Henry- and Langmuir sites.[10a] Henry's sites (matrix phase) are assumed to be of dynamic origin and support the mass transport inside the polymer barrier, while the nearly static Langmuir sites are associated with the free volume of polymer frozen in below the glass-transition temperature ($T_g$).[10b] A population of molecules sorbed in Langmuir sites is assumed to be nearly immobile ("sorption traps").[10c] However, many polymers exhibit an insignificant number of Langmuir sites, thus, further materials development may be necessary before the use of "sorption traps" (on the lower free-standing barrier films in a nitrogen spacer encapsulation architecture) exhibits practical utility.

One of the most expensive parts of many encapsulation architectures is the epoxy/adhesive attaching the overlying barrier to the underlying substrate (with the deposited Ca sample or fabricated device). It is therefore desirable to develop an encapsulation architecture which enables the use of a cheaper epoxy/adhesive with retained encapsulation performance.

Figure 3:
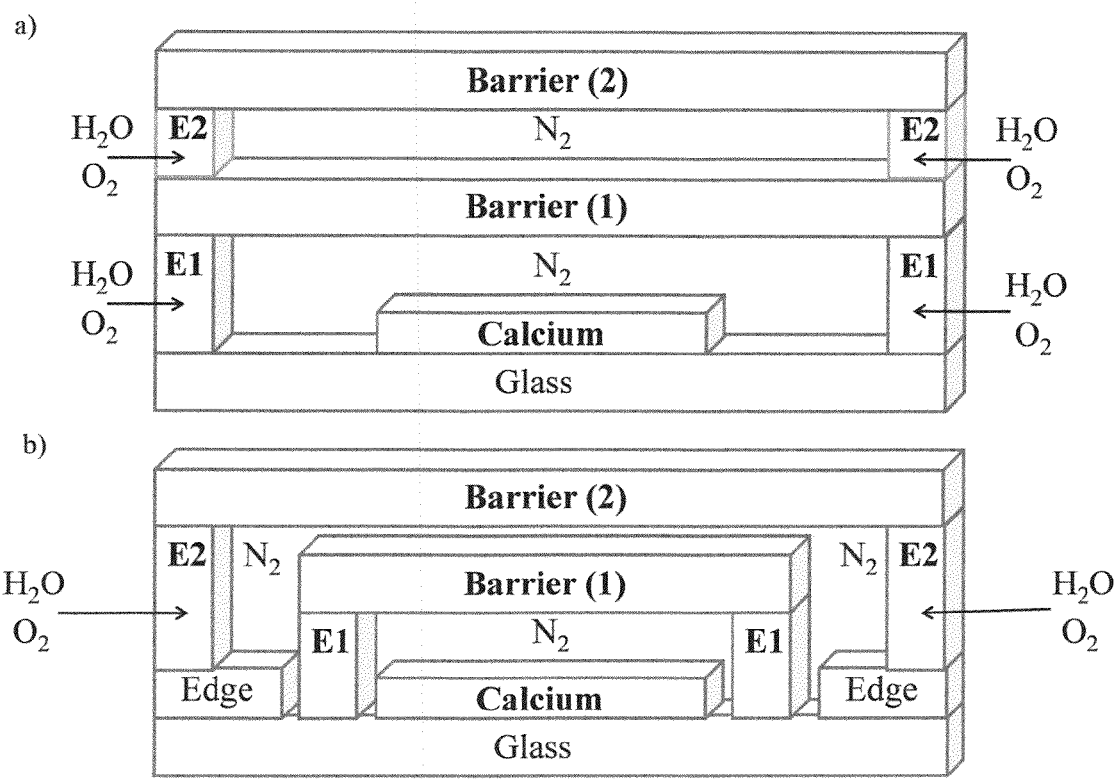
FIG. 3 shows a schematic depicting architectures to influence gas transmission through a flexible multilayer barrier where the free-standing barrier films are marked with ///, while the epoxy seals are marked with \\\. (a) Depiction of a calcium thin film encapsulated with a nitrogen gas-phase spacers between free-standing barrier films in a conventional architecture. E1 denotes an epoxy seal attaching Barrier (1) to the glass substrate while E2 denotes an epoxy seal attaching Barrier (2) to Barrier (1) (b) Depiction of a calcium thin film encapsulated with nitrogen gas-phase spacers between free-standing barrier films in a Russian Doll encapsulation architecture. E1 denotes an epoxy seal attaching Barrier (1) to the glass substrate while E2 denotes an epoxy seal attaching Barrier (2) to the glass substrate.

In one embodiment of our invention, FIGS. 3a and b show a conventional- and Russian Doll encapsulation architecture, respectively. E1 and E2 are encapsulating epoxy seals. Both E1 and E2 are directly exposed to air for the encapsulation architecture in FIG. 3a, while only E2 is directly exposed to air while E1 is surrounded by the $N_2$ spacer in FIG. 3b. A less permeable epoxy resin must be used for E1 in FIG. 3a, since this epoxy seal is constantly exposed to air (containing ~21% $O_2$ and ~1% $H_2O$). E1 in FIG. 3b, on the other hand, is initially only exposed to $N_2$, thus, a more permeable epoxy resin is acceptable for this epoxy seal, at least during the transient regime (until E1 is exposed to ~21% $O_2$ and ~1% $H_2O$). A higher accepted permeability limit of E1 means that a lower-performance (and cheaper) resin can be used for this epoxy seal.

Figure 4:
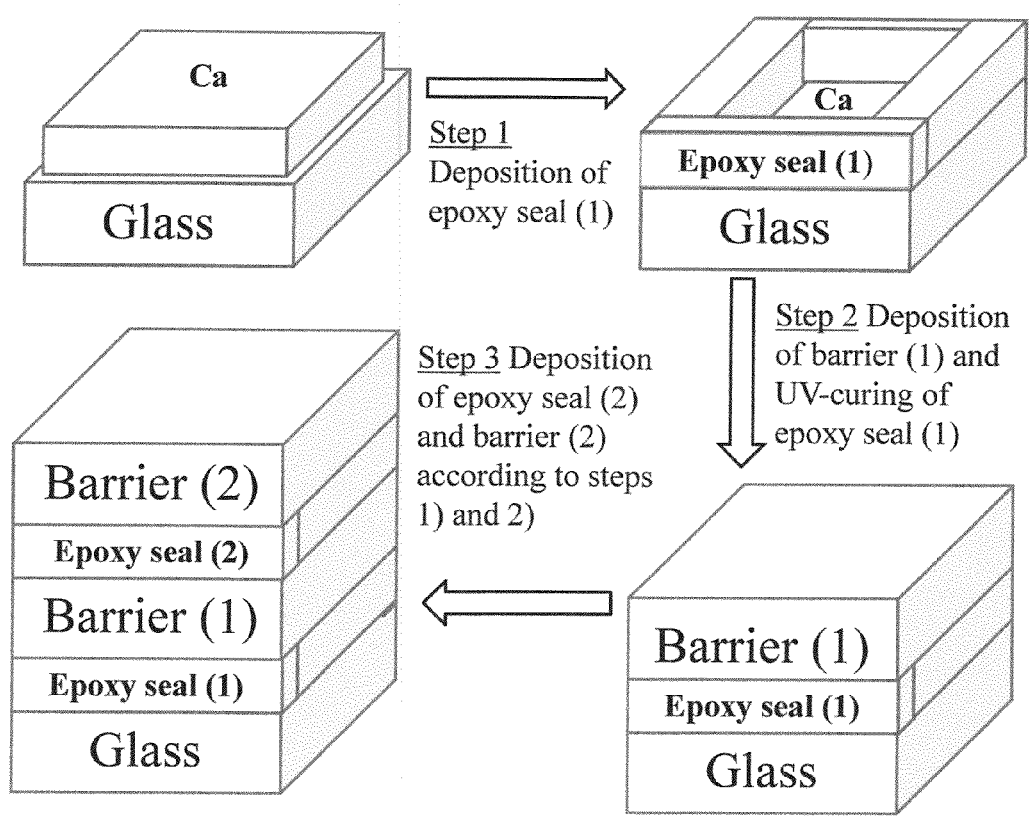
FIG. 4 shows a schematic depicting a typical fabrication procedure for an encapsulation architecture comprising nitrogen gas-phase spacers between free-standing barrier layers. All the fabrication steps were done in a dry box filled with nitrogen. The free-standing barrier films are marked with /// while the epoxy seals are marked with \\\.
Figure 5:
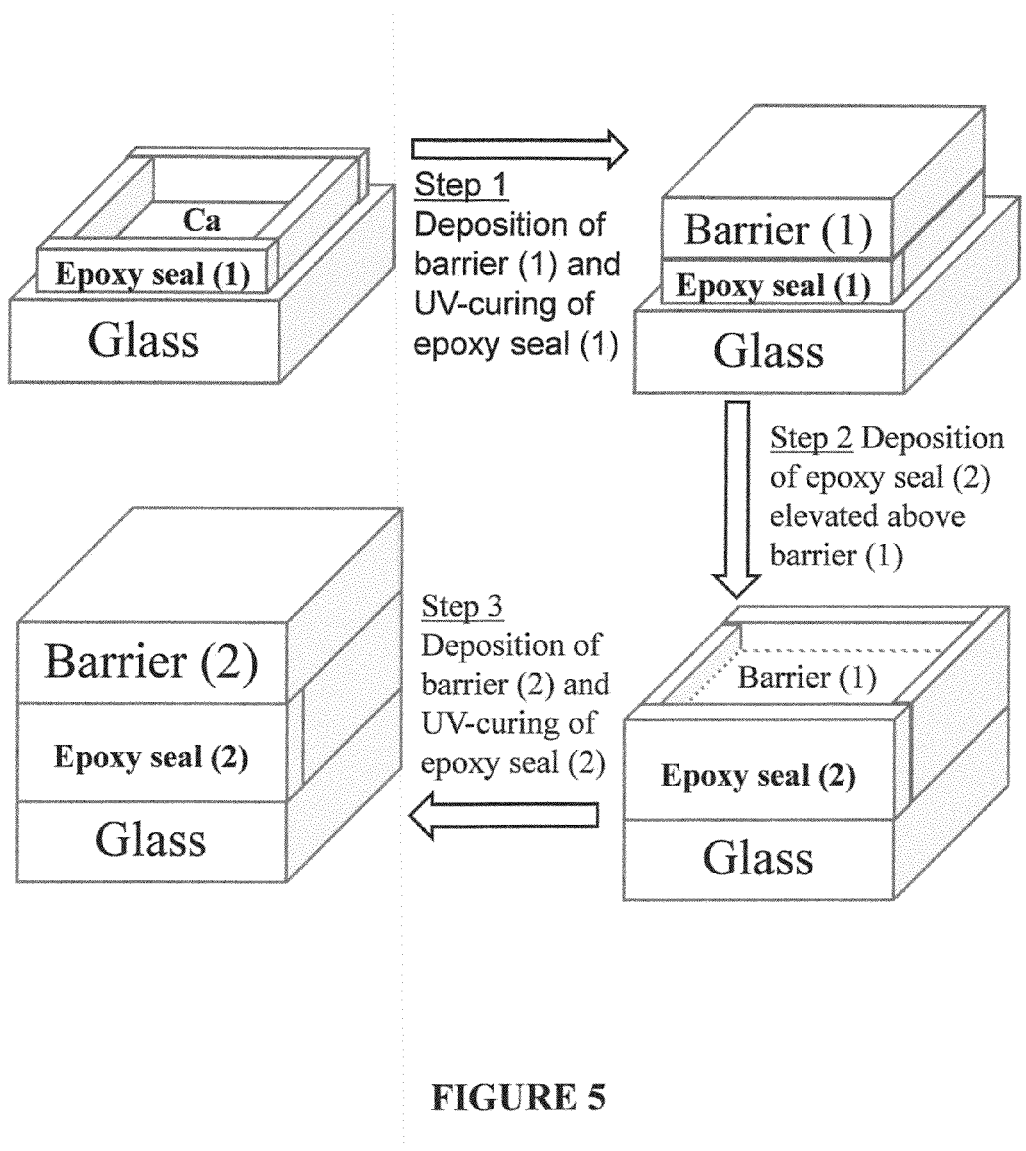
FIG. 5 shows a schematic depicting a typical fabrication procedure for a Russian Doll encapsulation architecture comprising nitrogen gas-phase spacers between free-standing barrier layers. All the fabrication steps were done in a dry box filled with nitrogen. The free-standing barrier films are marked with /// while the epoxy seals are marked with \\\.
Figure 6:
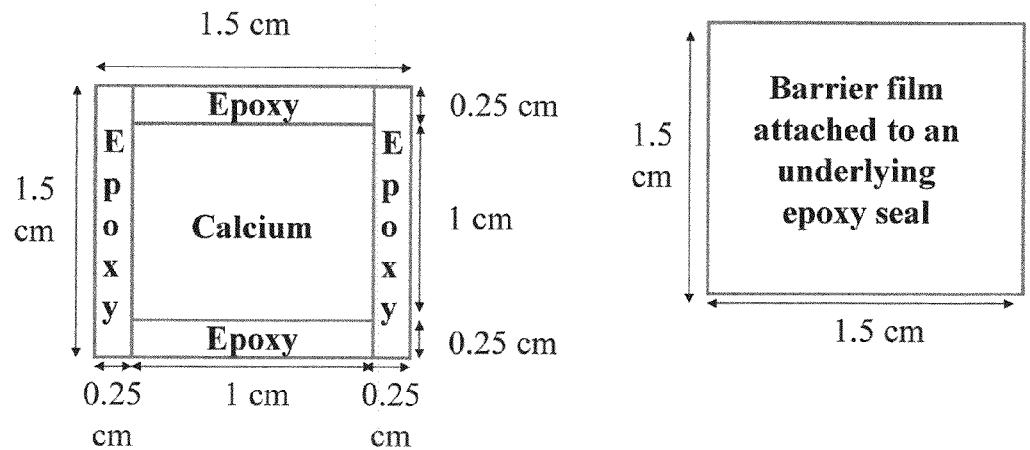
FIG. 6 shows typical dimensions for the encapsulation components for conventional architectures comprising nitrogen gas-phase spacers. E denotes an encapsulating epoxy seal. The free-standing barrier films are marked with /// while the epoxy seals are marked with \\\.
Figure 6:
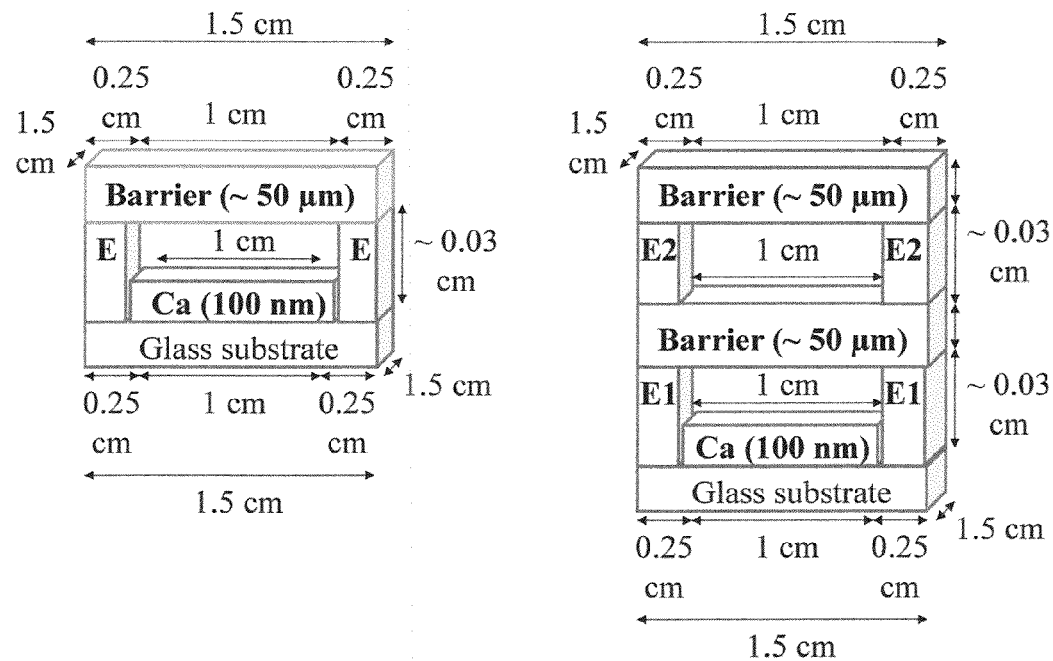
Figure 7:
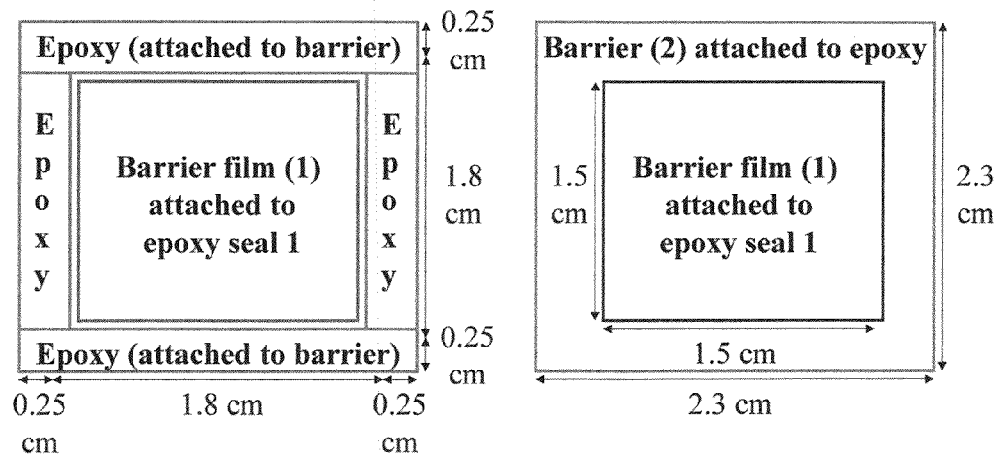
FIG. 7 shows typical dimensions for the encapsulation components for Russian Doll architectures comprising nitrogen gas-phase spacers. E denotes an encapsulating epoxy seal. The free-standing barrier films are marked with /// while the epoxy seals are marked with \\\.
Figure 7:
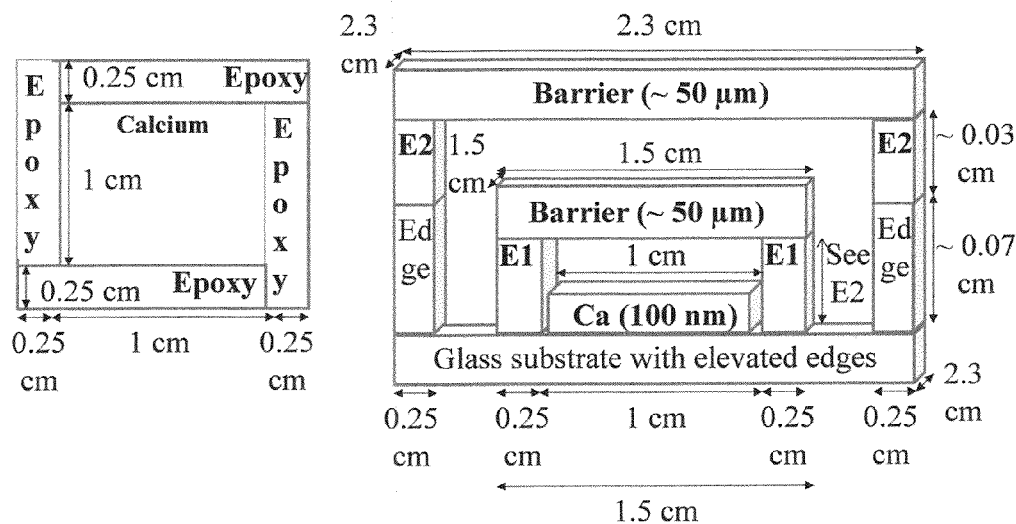

The epoxy is deposited on the transparent flexible film and subsequently sealed to the underlying transparent flexible film or encapsulated sample (Ca film or device) by using a UV-laser with a wavelength of 365 nm (Keyence UV-400), see FIGS. 4 and 5. The epoxy seal may be applied by hand but should preferably be applied by a machine to guarantee an automated and precise deposition of an epoxy seal with a well-defined width and thickness, which define the size of the spacer layer filled with inert gas. The size of the spacer layer may be relevant for the chemical potential gradients across the multi-sorption encapsulation, since the size of the gap determines the ratios of $O_2:N_2$ and $H_2O:N_2$ within the gas-phase spacer. Typical sizes for the gaps and encapsulation dimensions, used in this study, are shown in FIGS. 6 and 7. The dependence of encapsulation performance (Ca lifetime) on spacer volume has not been determined in this work, but initial studies utilizing low-performance PET barriers in a PET-$N_2$-PET structure seem to indicate that a 500% increase in the spacer volume only results in a 50% improvement (not shown) in encapsulation performance (Ca lifetime).

The gaps between barriers 1 and 2 determine the size of the $N_2$ spacer layers between these barriers. A large gap size means that it will take a longer time for sufficient $O_2$ and $H_2O$ species to permeate into the gas spacer prior to the establishment of the critical $O_2:N_2$ and $H_2O:N_2$ ratios required to initiate a driving force for steady state permeation through the barrier/inert gas architecture(s). However, a small gap size means the opposite—the critical $O_2:N_2$ and $H_2O:N_2$ ratios will be established faster leading to a quicker on-set of steady state permeation. However, for a sufficiently small gap size, the number of $O_2$ and $H_2O$ species in the gas pocket may not be sufficient to initiate (steady) state permeation through the barrier/inert gas architecture(s) at all. However, it is not clear at this point whether a sufficiently small $N_2$ spacer can be fabricated at a reasonable high throughput and at a competitive cost. It may not even be theoretically possible to obtain a cross-over point (from a slower on-set of steady state for large spacer volumes via a faster on-set of steady-state for smaller spacer volumes to slower on-set of steady states at sufficiently small spacer volumes) with regards to encapsulation performance (Ca lifetime) versus spacer volume.

Figure 8:
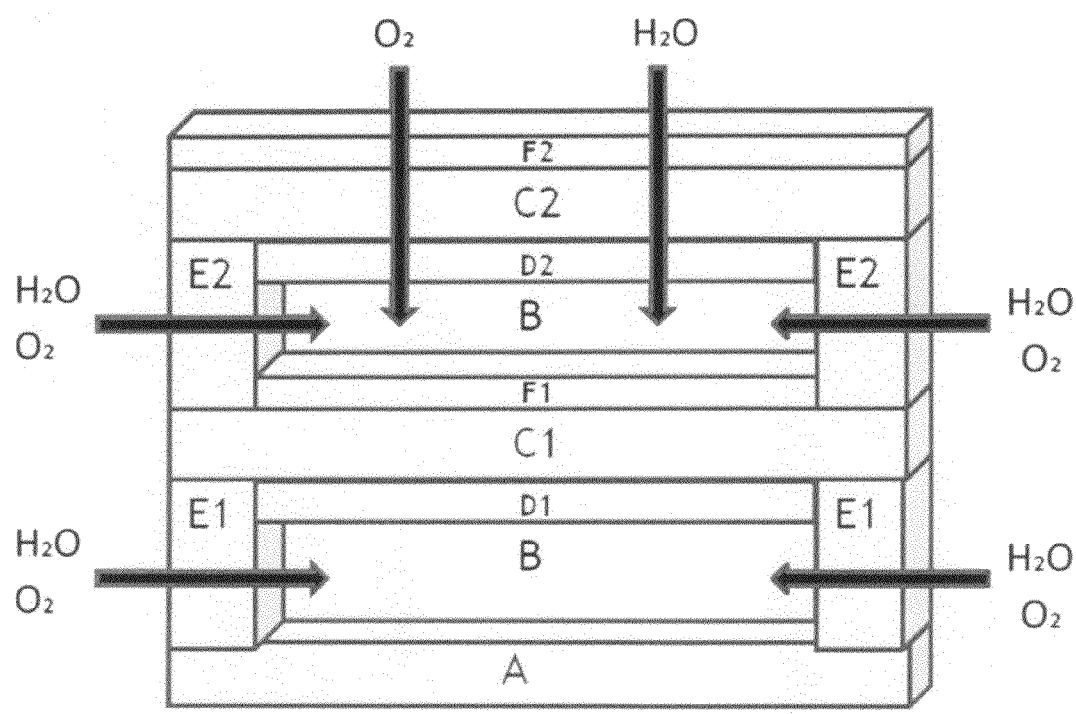
FIG. 8 shows a schematic depicting architecture to influence gas transmission through a flexible multilayer barrier where A is a Ca film or encapsulated device, B is inert gas such as Ar or $N_2$ or a mixture of two inert gases, e.g. Ar and $N_2$, C is a transparent flexible film, D is the desorption barrier, F is the sorption barrier, E is an encapsulating epoxy. E1 denotes an epoxy attaching C1 (first flexible film) to A, while E2 denotes an epoxy attaching C2 (second flexible film) to C1. The arrows depict permeation of $O_2$ and $H_2O$ in air into the encapsulation architecture. The permeation paths from air into the encapsulation architecture is E1, E2 and F/C2/D. F/C1/D is separated from F/C2/D with a nitrogen spacer, thus, there is no direct permeation path from air through F/C2/D.

The rates for sorption, diffusion and desorption may be minimized by utilizing specific barrier layers for these three processes. FIG. 8 shows a schematic depicting architecture to influence gas transmission through a flexible multilayer barrier where A is a Ca film or encapsulated device, B is inert gas such as Ar or $N_2$ or a mixture of two inert gases, e.g. Ar and $N_2$, C is a transparent flexible film, D1 and D2 are desorption barriers, F1 and F2 are sorption barriers, E is an encapsulating epoxy. E1 denotes an epoxy attaching C1 (first flexible film) to A, while E2 denotes an epoxy attaching C2 (second flexible film) to C1. The arrows depict permeation of $O_2$ and $H_2O$ in air into the encapsulation architecture. The permeation paths from air into the encapsulation architecture is E1, E2 and F/C2/D. F/C1/D is separated from F/C2/D with a nitrogen spacer, thus, there is no direct permeation path from air through F/C2/D. Materials candidates for the various candidates depend on their respective functionalities. Hydrophobic materials, e.g. the perfluorinated polymer Cytop™, may be a good candidate for the sorption barriers F1 and F2. Metal oxides, preferably sol-gel materials, may also be good candidates for F1 and F2. Glassy polymers, with a large number of Langmuir sites ("sorption traps") may also be used for F1, assuming that a sufficiently large number of Langmuir sites can be created on the polymer surface. A person of skill in the art would be able to determine other compounds that may be suitably used as sorption barriers. For instance, one would assess their hydrophobicity e.g. by determining whether they express a large contact angle for water droplets.

A large number of Langmuir sites on the surface of the glassy polymer barrier may be less beneficial for F2, since localized permeation through Henry sites will dominate at large partial pressures regardless of the distribution of Langmuir sites. However, Langmuir-dominated permeation dominates during the initial stages of the transient regime, thus, a glassy polymer barrier surface exhibiting a large number of Langmuir sites may be favorable for F1, assuming that the glassy polymer barrier surface exhibits a sufficiently larger number of Langmuir sites. It is not possible for us, at this time, to specify a critical minimum number of Langmuir sites for any significant benefits from using of a sorption barrier with an increased number of Langmuir sites for F1. The dependence of Langmuir sites versus significant encapsulation improvements may also vary between different nitrogen spacer encapsulations.

Materials candidates for the desorption barriers D1 and D2 may be oxygen- and/or water vapor binding molecules, e.g. $TiO_x$. The use of $TiO_x$ for the sorption barriers F1 and F2 may be less efficient than the use of $TiO_x$ for the desorption barriers D1 and D2, since $TiO_x$ may exhibit significant hydrophilicity (depending on the status of the hydrophobic/hydrophilic conversion process), thus, it attracts $H_2O$ and $O_2$ to the surface. A person of skill in the art would be able to determine other compounds that may be suitably used as desorption barriers. For instance, one would determine their hydrophilicity e.g. how efficiently they bind oxygen gas and water vapor.

In the case of F1 and F2, we want the layers to attract as little $H_2O$ and $O_2$, but for $D_1$ and $D_2$—on the other hand—we want the layers to attract $H_2O$ and $O_2$, thus, D1 and D2 can be somewhat hydrophilic materials. A less hydrophilic material may be required for D2, since F1 is a hydrophobic material, resulting in an accumulation of permeants in the $N_2$ spacer. Ca films, and devices to a lesser extent, beneath F2/B2/D2 is highly reactive, though, meaning that a more hydrophilic material may be necessary to aggressively prevent $O_2$ and $H_2O$ to react with the Ca film or device.

Figure 9:
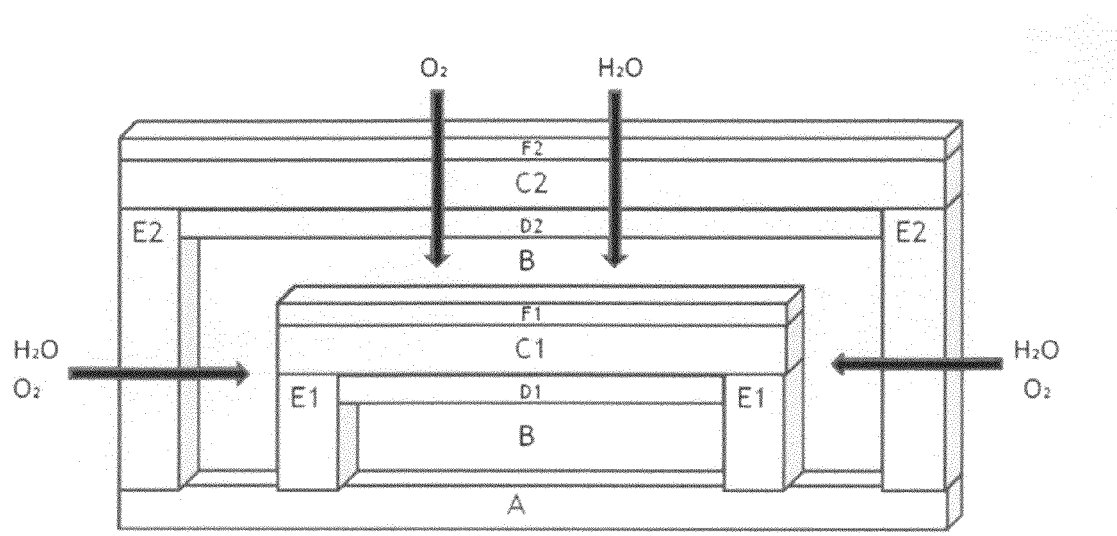
FIG. 9 shows a schematic depicting a Russian doll architecture to influence gas transmission through a flexible multilayer barrier where A is a Ca film or encapsulated device, B is inert gas such as Ar or $N_2$ or a mixture of two inert gases, e.g. Ar and $N_2$, C is a transparent flexible film, D is the desorption barrier, F is the sorption barrier, E is an encapsulating epoxy. E1 denotes an epoxy attaching C1 to A, while E2 denotes an epoxy attaching C2 to C1. The arrows depict permeation of $O_2$ and $H_2O$ in air into the encapsulation architecture. The permeation paths from air into the encapsulation architecture is E2 and F/C2/D. E2 is separated from E1 with a nitrogen spacer and F/C1/D is separated from F/C2/D with a nitrogen spacer, thus, there is no direct permeation path from air through E2 or F/C2/D.

FIG. 9 shows a schematic depicting a Russian doll architecture, where A is a Ca film or encapsulated device, B is an inert gas such as Ar or N, C is a transparent flexible film, D1 and D2 are sorption barriers, F1 and F2 are desorption barriers, E is an encapsulating epoxy. E1 denotes an epoxy attaching C1 (first flexible film) to A, while E2 denotes an epoxy attaching C2 (second flexible film) to C1. The permeability of E1 and E2 can be equal to the permeability of C1 and C2 in FIG. 9 without creating a favorable path for permeants. However, in FIG. 8, the permeability of E1 must be equal to C1/$N_2$/C2 without creating a favorable path for permeants. This means that the epoxy/adhesive used for E1 in FIG. 8 must have a lower permeability than the epoxy/adhesive used for E1 in FIG. 9 thus, the encapsulation may become more expensive than an equal structure in FIG. 9 where the barrier requirements for the epoxy/adhesive used for E1 and E2 can be the same. However, the structure in FIG. 9 may also require different viscosities for the two epoxies/adhesives, since E2 must be significantly higher than E1 to prevent barrier C2 from contacting C1 in the final encapsulation architecture. C2 bent over C1 may result in tension for E2 attached to A in FIG. 9, thus, it complicates the realization of encapsulation prototypes in academic labs where automated machines may not be used for the encapsulation process.

Figure 10:
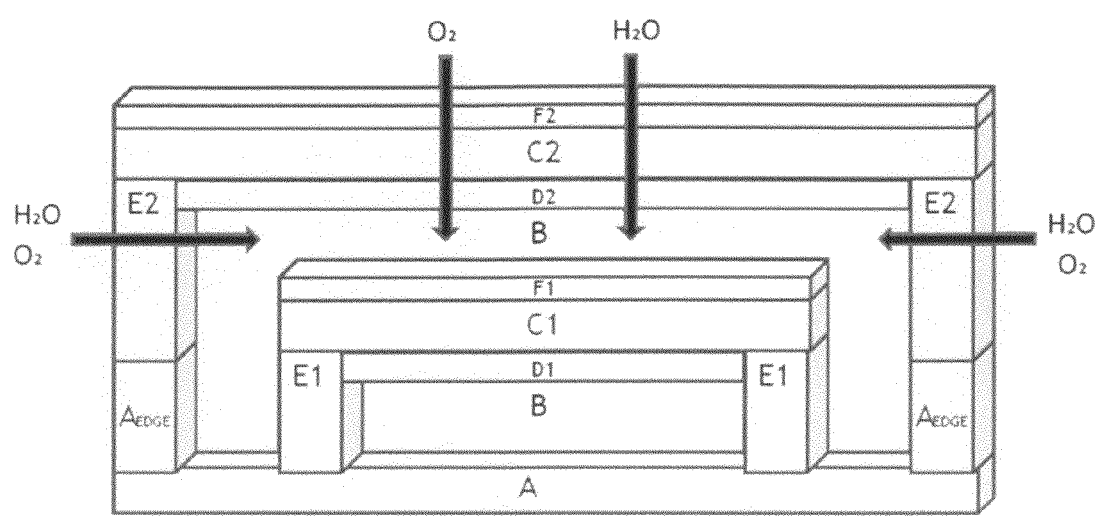
FIG. 10 shows a schematic depicting a Russian doll architecture to influence gas transmission through a flexible multilayer where A is a Ca film or encapsulated devices with elevated edges, B is an inert gas such as Ar or $N_2$, C is a transparent flexible film, D is the desorption barrier, F is the sorption barrier, E is an encapsulating epoxy. E1 denotes an epoxy attaching C1 to A, while E2 denotes an epoxy attaching C2 to C1. The arrows depict permeation of $O_2$ and $H_2O$ in air into the encapsulation architecture. The permeation paths from air into the encapsulation architecture is E2 and F/C2/D. E2 is separated from E1 with a nitrogen spacer and F/C1/D is separated from F/C2/D with a nitrogen spacer, thus, there is no direct permeation path from air through E2 or F/C2/D.

FIG. 10 shows a revised Russian doll architecture with a Ca film or encapsulated device deposited on a rigid glass substrate with elevated edges (as depicted by $A_{edge}$). This kind of rigid glass substrate is used for various encapsulation architectures, e.g. Mitsubishi's commercial encapsulation lid for organic light-emitting diodes. E1 attaches C1 to A in FIG. 10, same as in FIG. 9. However, in FIG. 10, E2 attaches C2 to $A_{edge}$, eliminating the possibility that C2 might contact C1 during the encapsulation process. Although this approach is probably, not suitable for commercialization, it is suitable for optimizing new flexible barrier films developed in academic and industrial labs for the multiple-sorption structure, since encapsulation by hand can be easily done without using epoxies/adhesives with different viscosities.

Figure 11:
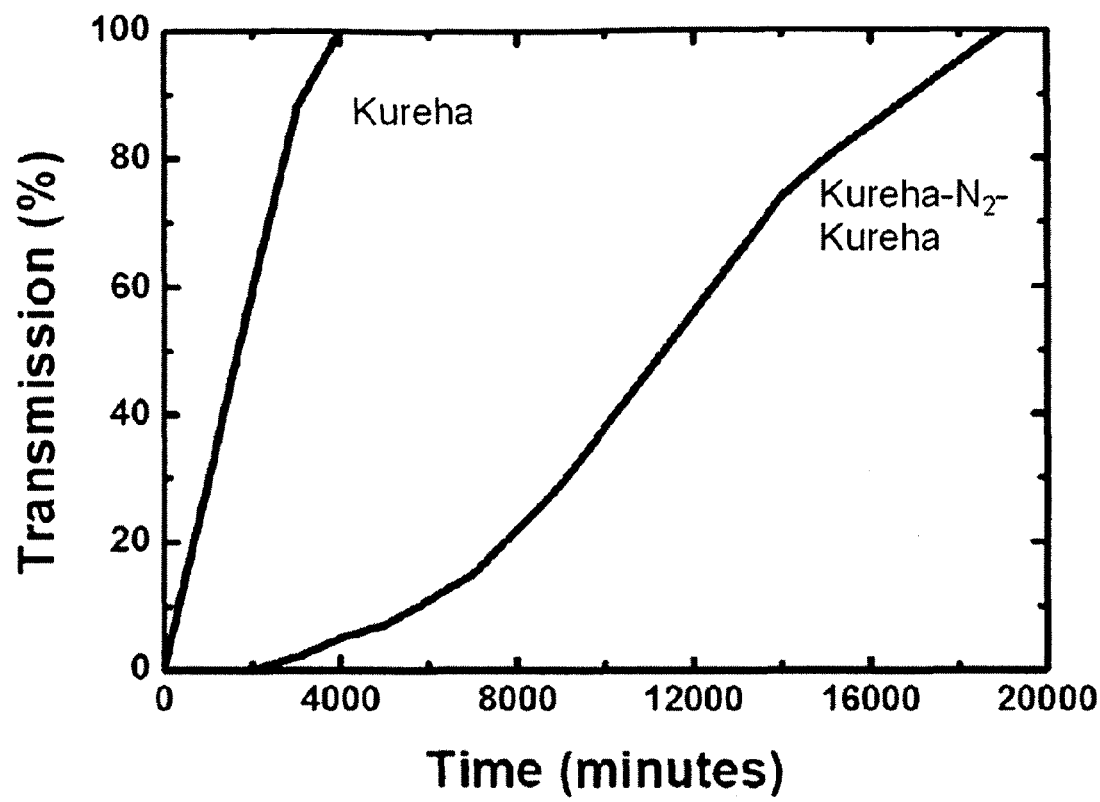
FIG. 11 shows calcium thin film optical transmission test at 20° C. and 60% relative humidity (RH). Transmission is plotted as a function of time for a Ca film encapsulated with Kureha (blue) and Kureha-spacer-Kureha (red).

FIG. 11 shows a calcium thin film optical transmission test[10d] for Kureha (left curve) and Kureha-$N_2$-Kureha (right curve). The temperature was 20° C. and the relative humidity was 60% for all of the runs in this study. The left curve exhibits a water vapor transmission rate (WVTR) of approximately $5*10^{-2}$ g/$m^2$, day (assuming that oxygen permeation isn't significant during the first 4000 minutes of air exposure). The right curve exhibits a WVTR of approximately $1*10^{-2}$ g/$m^2$, day. This value may be sufficiently low to fulfill the encapsulation requirements for some applications, e.g. organic field-effect transistors (OFETs), but it is too high to fulfill the encapsulation requirements for OLEDs and OPVs. However, this result still seems to indicate that the Kureha- N$_2$-Kureha structure (right curve) exhibits a lower WVTR than what we would expect from a single Kureha structure with a thickness that is 2× larger than the thickness for the single Kureha barrier (left curve) in this study. However, it is not absolutely certain that steady state is established during the test period and conditions used in this study—what appears to be steady state for the left run may simply be a final stage of the transient regime. Nevertheless, the transient regime is still significantly extended for the right curve, which exhibits 0% detectable Ca degradation during the first 2000 minutes of the test. The apparent steady-state rate (the fastest degradation rate of the calcium film during this study) was obtained after ~300 minutes for the left curve while it was obtained after ~9000 minutes for the right curve. Theoretically, for single-layer barriers, a 2× increase in barrier thickness should be equal to a 4× increase in lag-time (the time it takes to reach steady-state). If steady-state is indeed obtained after ~300 minutes for the left curve, then the right curve exhibits (at least) a 30× improvement in lag-time. If the Ca degradation rate obtained after ~9000 minutes for the right curve correlates to a final stage of the transient regime, then the improvement in lag-time between the left and right curves is greater than 30. We may have not been able to quantify the relative definite encapsulation performance improvements during the transient regime versus the possible encapsulation performance improvements during the steady-state regime in this study. Nevertheless, it is apparent that device lifetimes will be enhanced for devices using the spacer layers versus devices that do not.

Figure 12:
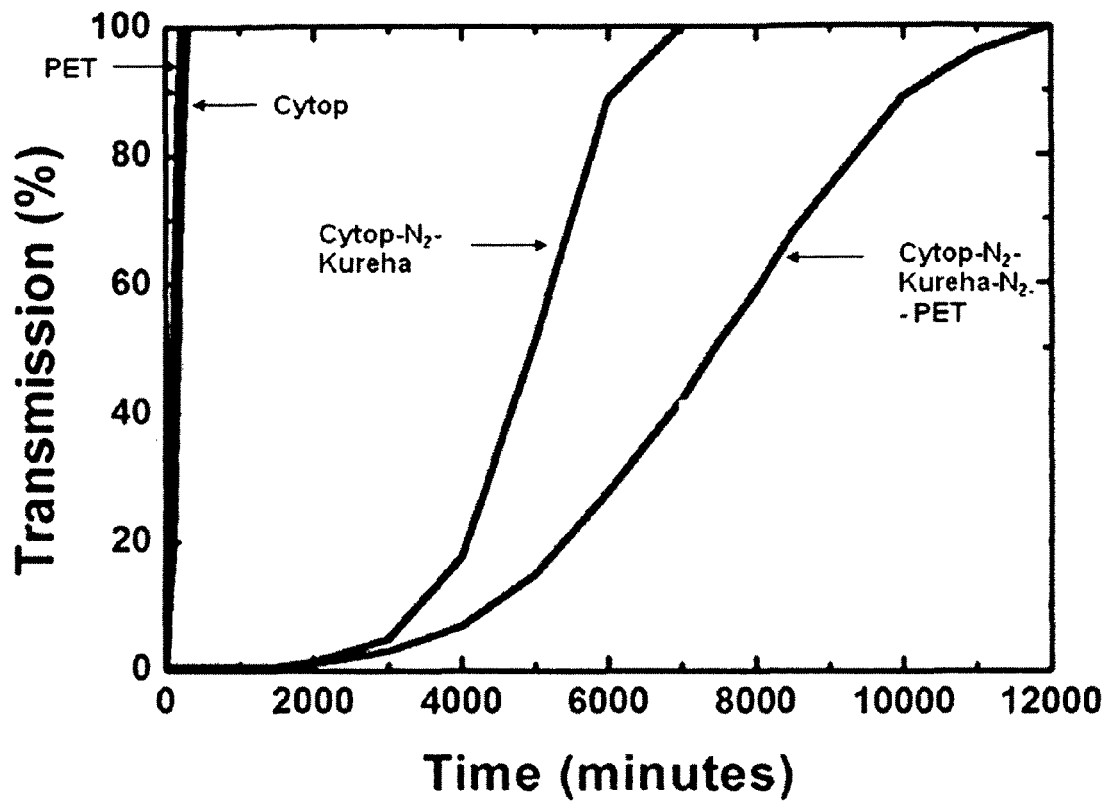
FIG. 12 shows calcium thin film optical transmission test at 20° C. and 60% relative humidity (RH). Transmission is plotted as a function of time for a Ca film encapsulated with PET (100 μm) (blue), Cytop™ (red), Cytop™-epoxy-Kureha (purple) and Cytop™-epoxy-Kureha-epoxy-PET (100 μm) (green).

FIG. 12 shows transmission vs. time for Ca samples encapsulated with PET (left-most curve), Cytop™ (mid-left curve), Cytop™-N$_2$-Kureha (mid-right curve) and Cytop™-N$_2$-Kureha-N$_2$-Cytop™ (right-most curve); measured Ca lifetimes were 200, 300, 7000 and 12000 minutes respectively. The temperature was 20° C. and the relative humidity was 60% for all of the runs in this study. The samples containing spacers show substantially slowed transient regimes and, as in the Kureha-only runs in FIG. 11, have steady-state permeation rates markedly slower than the values expected from simple barrier additively. It is quite remarkable that a single PET film, an ultra-low cost material which yields a lifetime of only 200 minutes when used as single barrier film (left-most curve) results in improvement of the Ca lifetime for the Cytop™-spacer-Kureha barrier (mid-right curve) from 7000 to 12000 minutes (right-most curve). Accordingly, barrier films, in a multi-matrix structure (consisting of N2 spacer layers), can exhibit up to 25×-100× greater contributions to improved Ca lifetime compared with the same barrier in a single-matrix structure (without N2 spacers).

Figure 13:
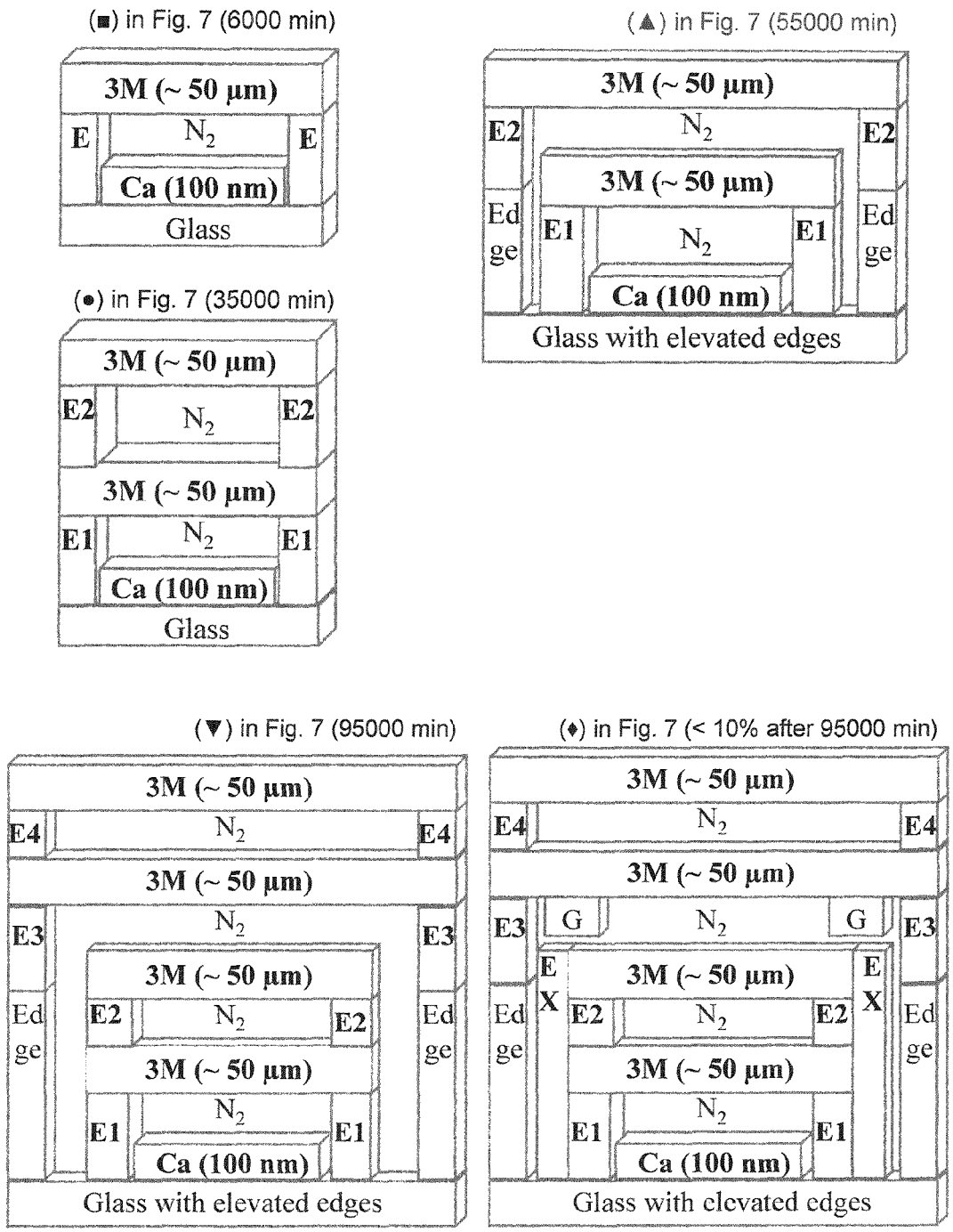
FIG. 13 shows the encapsulation architectures for the runs corresponding to squares (■), circles (●), upward triangles (▲), downward triangles (▼) and diamonds (♦) in FIG. 14. The free-standing barrier films are marked with /// while the epoxy seals are marked with \\\. The time required for complete degradation of the Ca film for the runs corresponding to ■, ●, ▲ and ▼, and <10% degradation of the Ca film corresponding to ♦, is indicated above each illustration. The calcium lifetime tests were conducted at 20° C. and 60% relative humidity.

FIGS. 13a and 13b show in total five encapsulation structures and the corresponding calcium lifetimes (transmission vs. time in FIG. 14), except for the run corresponding to (♦) which exhibited less than 10% degradation after 95000 minutes (the end of this study). The temperature was 20° C. and the relative humidity was 60% for all of these runs. The run corresponding to squares (■), utilizing a single 3M barrier matrix, is used as a benchmark for the runs corresponding to circles (●), upward triangles (▲), downward triangles (▼) and diamonds (♦)—the structures corresponding to these structures all comprise nitrogen spacers in their architectures. The run corresponding to circles (●), utilizing two 3M barrier matrices separated by a nitrogen spacer, is used to evaluate whether edge permeation through the epoxy seal attaching the bottom 3M barrier matrix to the glass substrate is a significant gas permeation path for the sample dimensions and epoxy resin used in this study. Please note that both epoxy seals are directly to air in this structure. The run corresponding to upward triangles (▲), utilizing two 3M barrier matrices separated by a nitrogen spacer in a Russian Doll structure, is used to evaluate whether edge permeation can be reduced by encapsulating the first barrier/epoxy pair within a second barrier/epoxy pair. Please note that only one epoxy seal, the one attaching the top free-standing barrier film to the glass substrate, is directly exposed to air in this structure. The run corresponding to downward triangles (▼), utilizing four 3M barrier matrices separated by nitrogen spacers in a Russian Doll structure, examines the maximum lifetime which can be obtained with the sample dimensions, barrier matrices and epoxy seals used in this study. The run corresponding to diamonds (♦), utilizing the same architecture as the run corresponding to downward triangles (▼) with the addition of a rim seal (epoxy seal "EX" in FIG. 13) and a dynamic moisture getter (type HD-S050914W400) cut into four equally large pieces (two of them are marked as "G" in FIG. 13) and attached as a "sticker" to the edges of the structure (the dynamic moisture getter has an adhesive on one side of the film).

Figure 14:
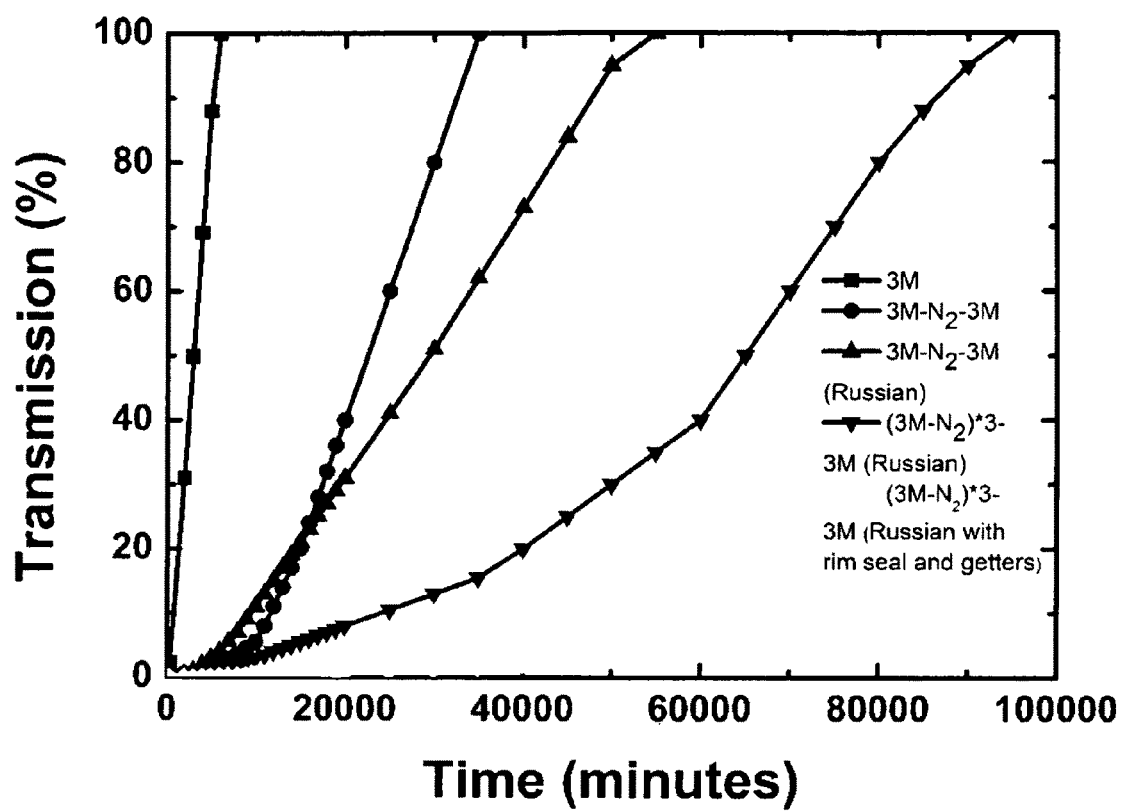
FIG. 14 shows calcium thin film optical transmission tests at 20° C. and 60% relative humidity (RH). Transmission is plotted as a function of time for a Ca film encapsulated with 3M (squares), 3M-spacer-3M in a conventional structure (circles), 3M-spacer-3M in a Russian Doll structure (upward triangles), 3M-spacer-3M-spacer-3M-spacer-3M in a Russian Doll structure (downward triangles) and 3M-spacer-3M-spacer-3M-spacer-3M in a Russian Doll structure with a rim seal and dynamic moisture getter (diamonds). The temperature was 20° C. and the relative humidity was 60% for all of these runs.
Figure 15:
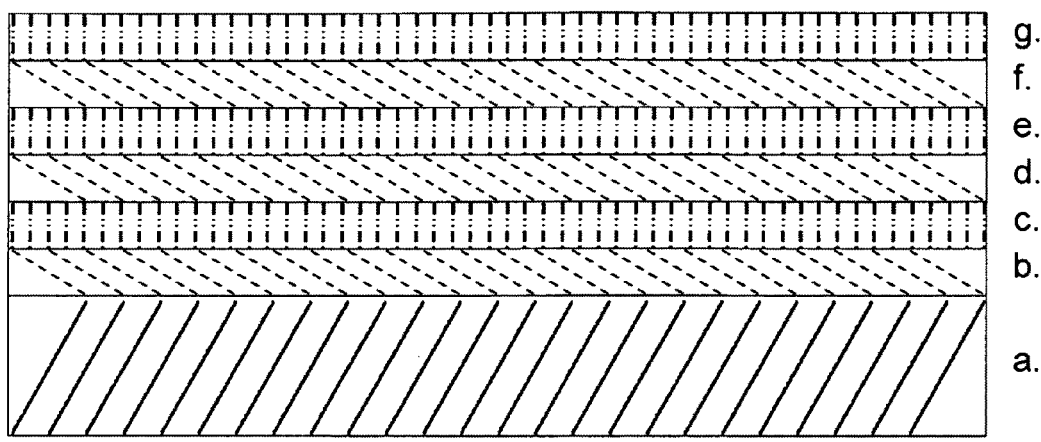
FIG. 15 depicts a composite structure of multilayer thin film on a flexible substrate: a) transparent, opaque or translucent flexible substrate, (b) hybridized sol-gel layer from one to eight-hundred nanometers in thickness acting as the active barrier, (c) thiol-ene elastomeric buffer layer from one-hundred nanometers to eight microns in thickness acting as the passive barrier and special separator of active barrier defects, (d) hybridized sol-gel layer from one to eight-hundred nanometers in thickness acting as the active barrier, (e) thiol-ene elastomeric buffer layer from one-hundred nanometers to eight microns in thickness acting as the passive barrier and special separator of active barrier defects, (f) hybridized sol-gel layer from one to eight-hundred nanometers in thickness acting as the active barrier, (g) thiol-ene elastomeric layer from one-hundred nanometers to eight microns in thickness acting as an abrasion, scratch and impact resistant terminating layer.
Figure 16:
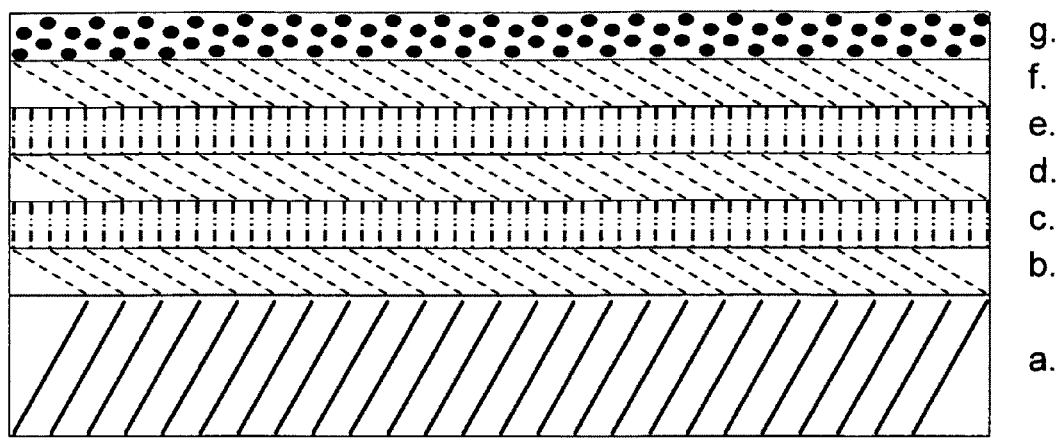
FIG. 16 depicts a composite structure of multilayer thin film on a flexible substrate: a) transparent, opaque or translucent flexible substrate, (b) hybridized sol-gel layer from one to eight-hundred nanometers in thickness acting as the active barrier, (c) thiol-ene elastomeric buffer layer from one-hundred nanometers to eight microns in thickness acting as the passive barrier and special separator of active barrier defects, (d) hybridized sol-gel layer from one to eight-hundred nanometers in thickness acting as the active barrier, (e) thiol-ene elastomeric buffer layer from one-hundred nanometers to eight microns in thickness acting as the passive barrier and special separator of active barrier defects, (f) hybridized sol-gel layer from one to eight-hundred nanometers in thickness acting as the active barrier, (g) thiol-ene elastomeric layer from one-hundred nanometers to eight microns in thickness containing dispersed additives such as oxide, metallic, semi-conducting and/or clay nanoparticles acting as a diffusion barrier and an abrasion, scratch and impact resistant terminating layer
Figure 17:
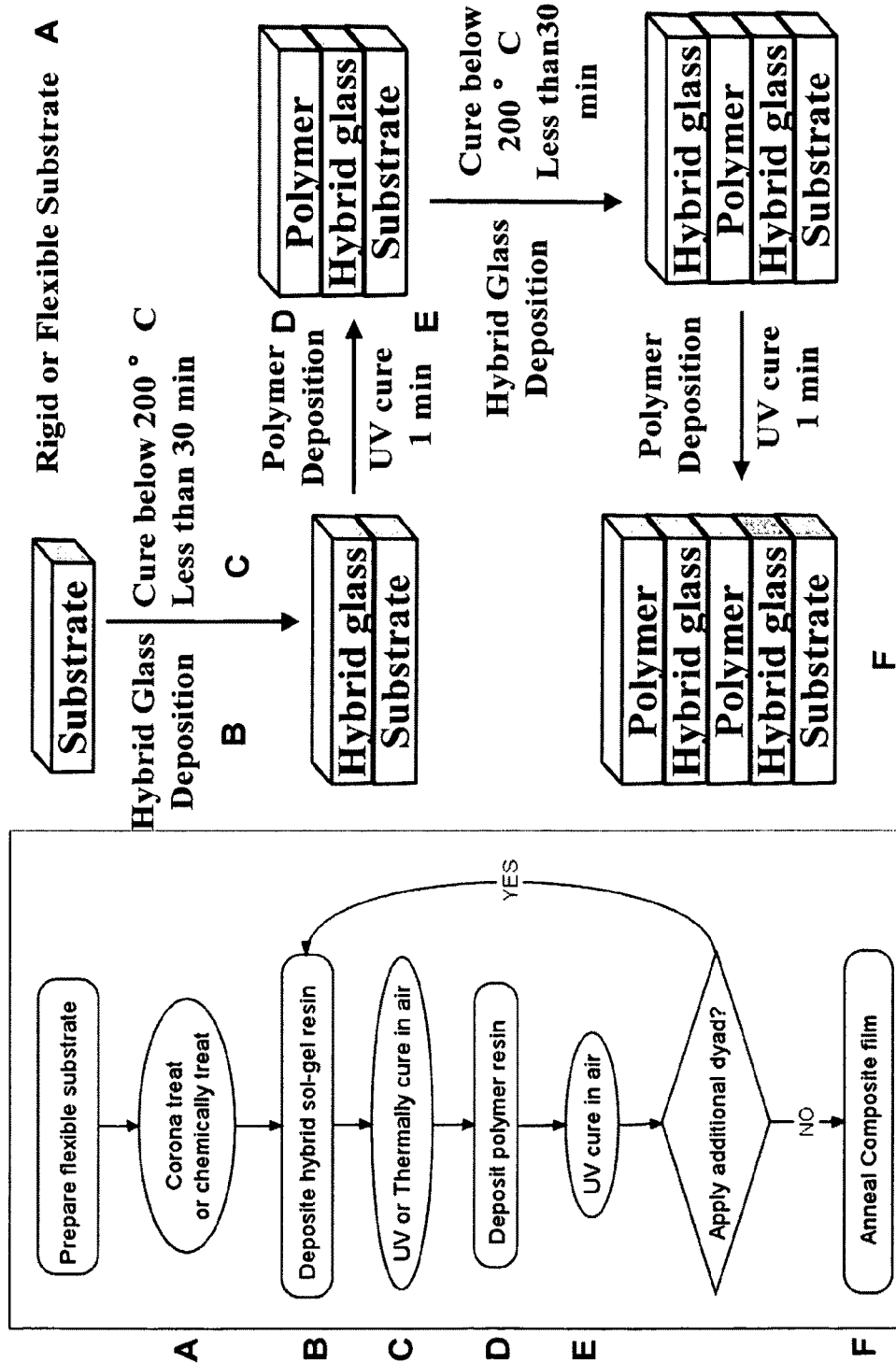
FIG. 17 depicts a process flow diagram for solution deposition of multilayer composite thin films: (A) is a general process to prepare a surface to promote chemical bonding between a substrate and a hybridized sol-gel, (B) is a process to deposit a liquid hybridized sol-gel resin on a 2-D surface, (C) is a process that cures a liquid hybridized sol-gel resin through cross-linking by heat and/or light, (D) is a process to deposit a liquid thiol-ene resin on a 2-D surface, (E) is a process that cures a liquid thiol-ene resin through cross-linking by heat and/or light, (F) is a process which anneals the composite multilayered film architecture by heat and/or light.
Figure 18:
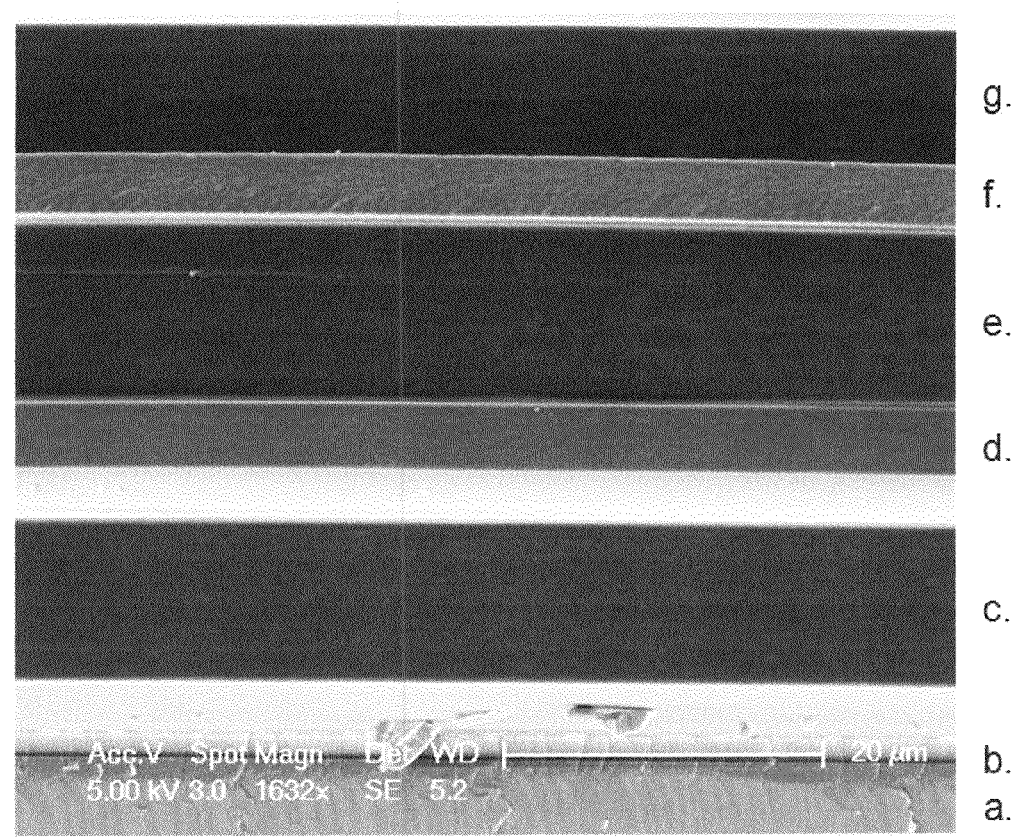
FIG. 18 is a representative SEM image of a flexible, transparent multilayered composite thin films (made by the process outlined in FIG. 17): a) oriented PET substrate, (b) hybridized sol-gel layer, (c) thiol-ene elastomeric layer, (d) hybridized sol-gel layer containing flourine, (e) thiol-ene elastomeric layer, (f) hybridized sol-gel layer containing flourine, (g) thiol-ene elastomeric terminating layer.
Figure 19:
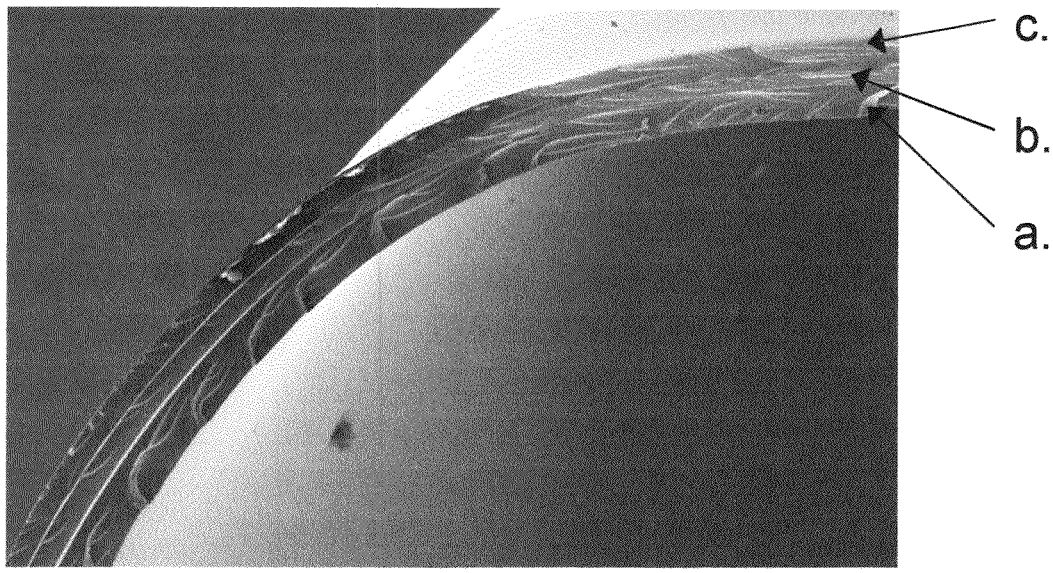
FIG. 19 is a representative SEM image of another flexible, transparent multilayered composite thin film under flexural stress made by process outlined in FIG. 17 but where the "substrate" is thiol-ene and the terminating layer is thiol-ene: a) thiol-ene elastomeric layer, (b) hybridized sol-gel layer, (c) thiol-ene elastomeric layer film illustrating robust interfacial adhesion.
Figure 19:
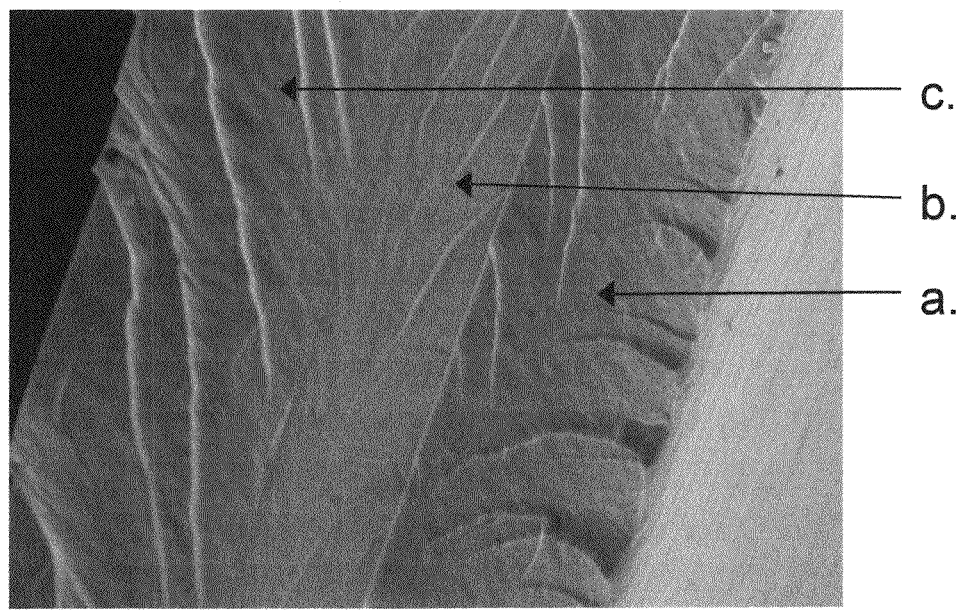

FIG. 14 shows the transmission vs. time for a Ca sample encapsulated with 3M (■squares), 3M-spacer-3M in a conventional structure (●circles), 3M-spacer-3M in a Russian Doll structure (▲upward triangles) and 3M-spacer-3M-spacer-3M-spacer-3M in a Russian Doll structure (▼downward triangles); the Ca lifetimes are 6000, 35000, 55000 and 95000 minutes respectively. FIG. 18 also shows transmission vs. time for a Ca sample encapsulated with 3M-spacer-3M-spacer-3M-spacer-3M in a Russian Doll structure with a rim seal and a dynamic moisture getter (♦diamonds); the calcium exhibits less than 10% degradation after 95000 minutes in air. In the encapsulation architectures used for the runs corresponding to squares (■) and circles (●), it is possible for air to reach the calcium by diffusing through a single layer of epoxy, without passing through any 3M barrier. The additional 3M barrier in the architecture for the run corresponding to circles (●) increases the calcium lifetime by more than an order of magnitude, indicating that the epoxy is not the primary contaminant entry route for the one-barrier architecture for the run corresponding to squares (■). The importance of diffusion through the epoxy in multi-barrier encapsulations, and the utility of the Russian Doll architecture, can be inferred from the permeation data of the runs corresponding to circles (●) and upward triangles (▲). The run corresponding to upward triangles (▲) has an upper layer with three times the area of upper barrier of the run corresponding to circles (●); if the epoxy were completely impermeable, this additional barrier area would result in a higher gas permeation rate for the run corresponding to upward triangles (▲) during steady-state diffusion. The larger gas spacer of the architecture for the run corresponding to upward triangles (▲) could help slow diffusion relative to the run corresponding to circles (●), but only in the transient regime. Instead, the permeation data show that the Russian doll architecture (the run corresponding to upward triangles (▲) has a slower permeation rate at apparent steady state. This suggests that diffusion through the epoxy layer is an important path of contaminant entry for the two-barrier encapsulation for the run corresponding to circles (●); the additional epoxy barrier introduced by the Russian doll architecture for the run corresponding to upward triangles (▲) interferes with this pathway and thereby reduces the overall gas permeation rate. The faster observed initial permeation rate of the architecture for the run corresponding to upward triangles (▲) is likely due to the larger upper-barrier area, and so a more tightly nested Russian doll architecture may yield further improvement in calcium lifetime.

To confirm the importance of permeation through the epoxy, a calcium lifetime test was conducted for a glass lid of the same size as the large 3M barrier, attached to a glass substrate with an epoxy seal. Total degradation of the calcium film occurred in ~32000 minutes (not shown), of comparable magnitude to the calcium lifetime of the run, corresponding to circles (●) and thus confirmation that permeation through the epoxy is non-negligible for that system. We note that although the calcium degradation times of these two architectures are numerically similar, the glass-barrier system had a larger exposed epoxy area and so this test does not indicate that barrier permeation is negligible for the run corresponding to circles (●).

The encapsulation employed for the run corresponding to downward triangles (▼) incorporates additional 3M barrier layers into the basic Russian doll architecture; the long 95000 minute calcium degradation time, and the substantial transient delay before reaching the apparent steady state regime after 60000 minutes, confirm that low-cost materials employed in a Russian doll architecture can produce high-performance encapsulations. The run corresponding to downward triangles (▼) was paused after 80000 minutes and the Ca film was observed by eye—it was clear that the calcium film had mainly degraded on one side of the sample (not shown), suggesting that edge permeation constituted the primary permeation path through this architecture. The asymmetric permeation around the edge also suggests that an encapsulation defect may have occurred, which may be related to the sudden increase in the permeation rate, and odd shape of the transmission curve, after 60000 minutes. The dominant nature of edge permeation confirms the value of a Russian Doll-style encapsulation; it is likely that the Ca lifetime for the run corresponding to downward triangles (▼) could have been substantially improved if all four barriers were configured in a closely-packed Russian Doll configuration. The encapsulation employed for the run corresponding to rotated squares (♦) utilize the same Russian Doll architecture as the run corresponding to downward triangles (▼) with the addition of a rim seal and a dynamic moisture getter. A substantial transient delay and a reduced apparent steady-state rate is observed compared with the run corresponding to downward triangles (▼). The efficiency of the dynamic moisture getter was evaluated with an encapsulation structure utilizing a 100 micron poly ethylene terephthalate (PET) barrier film (not shown). The calcium lifetimes of a PET-spacer-PET structure increases from 550 minutes to 1300 minutes if the dynamic moisture getter is incorporated into the structure (not shown), thus, the improvement observed for the run corresponding to rotated squares (♦) must be a product of both the rim seal and the dynamic moisture getter. The Ca lifetime for the run corresponding to diamonds (♦) in FIG. 18 indicate a WVTR value of 0.00021 g/(m$^2$, day) for the calcium volume and test conditions used in this study. This calcium lifetime predict device lifetime of more than 10 years for the P3HT:PCBM bulk heterojunction organic photovoltaic (OPV) modules fabricated and tested by Konarka Technologies (Lowell, Mass.).[10e] The use of low cost barrier/epoxy pairs, separated by nitrogen spacers in a Russian Doll encapsulation, may therefore provide a route towards cost-efficient encapsulation of OPVs and other plastic electronic devices.

Figure 20:
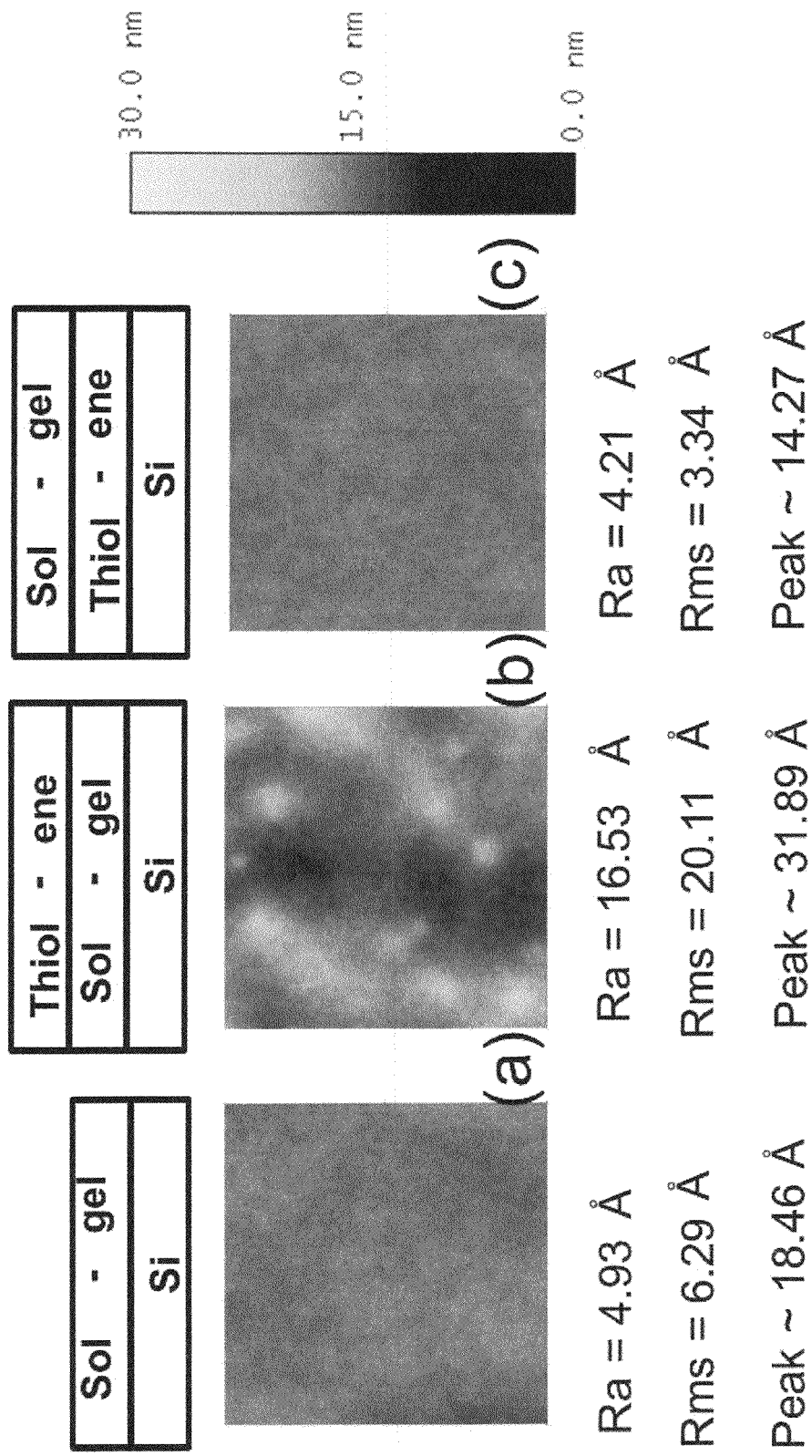
FIG. 20 is a representative AFM analysis of said hybridized sol-gel/thiol-ene multilayered thin film that illustrates surface roughness (a) single layer of hybridized sol-gel, (b) layer of thiol-ene coated on top of hybridized sol-gel, and (c) layer of hybridized sol-gel coated on top of a layer of thiol-ene. (Ra=mean roughness, Rms=root-mean-square roughness, Peak=average peak height).
Figure 21:
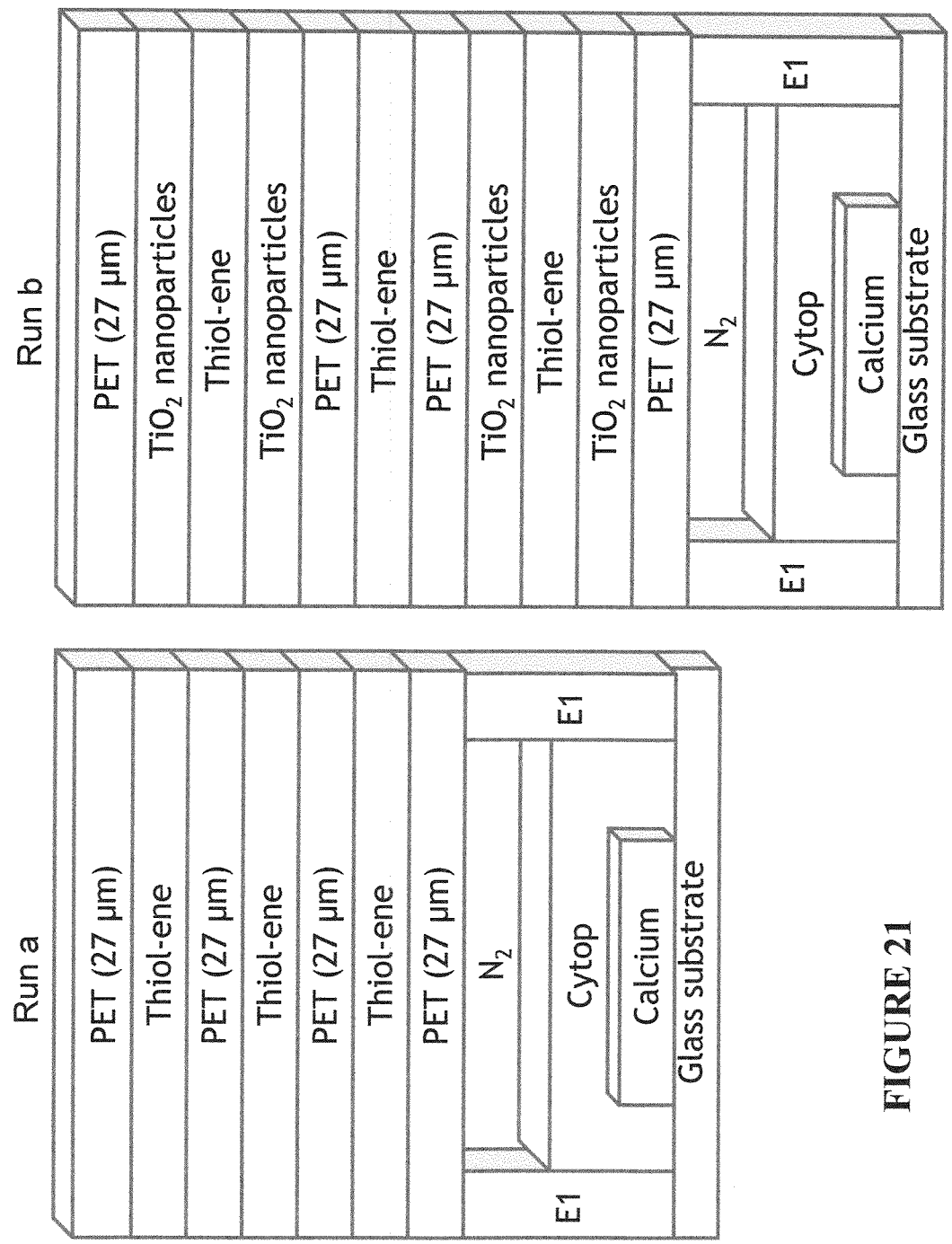
FIG. 21 shows the encapsulation architectures corresponding to run A and run B in FIG. 22.

FIG. 21 Illustrates uniform interfaces and layer thicknesses of hybrid glass sandwiched between thiol-ene elastomeric films. Investigation of layered film structures similar to that shown in FIG. 20 revealed tolerant and robust interfacial adhesion in various structural conformations. The only failure mode detected was in the most extreme conformation, a 180° bend followed by pressure to form a crease. This resulted in perpendicular cleavage, with respect to the interfacial surface, of the bulk hybrid glass.

FIG. 20 illustrates the typical surface roughness (indicating micro- and nanoscopic defects enabling rapid vapor permeation through the matrix) of hybridized sol-gel glass and thiol-ene. The hybrid glass is impressively uniform, showing very little variance both on a native substrate and coated on thiol-ene. Thiol-ene is relatively rougher. This is thought to result from a combination of extremely rapid UV curing and higher surface tension at the air interface with respect to the sub-layer.

Figure 24:
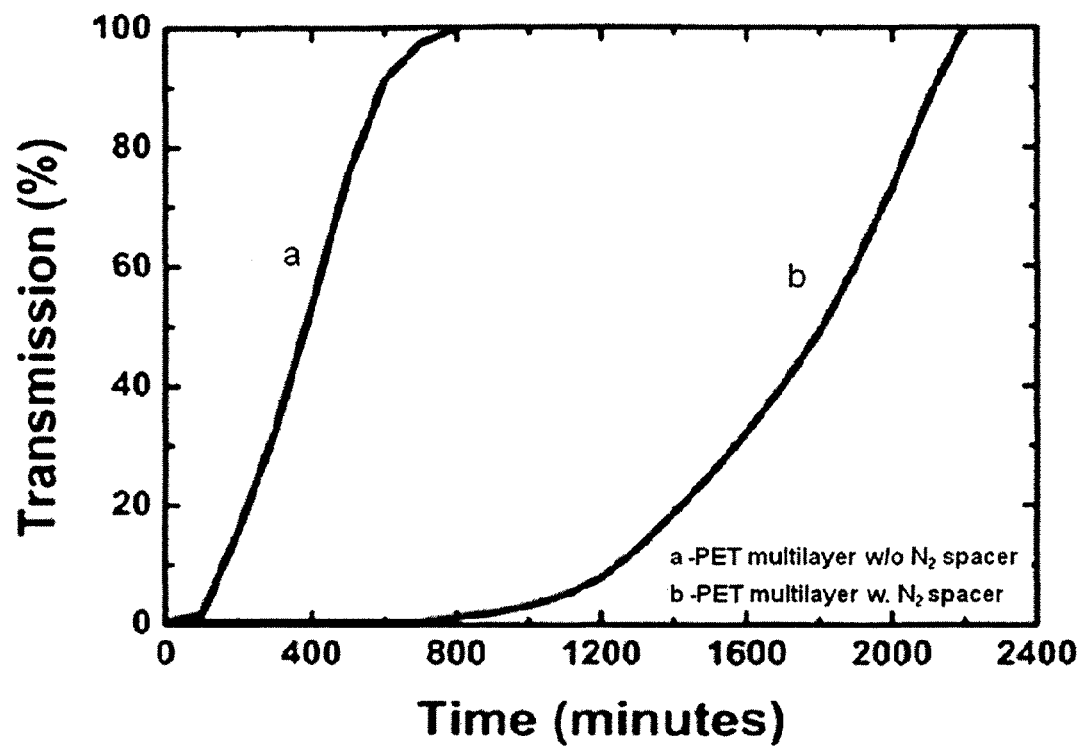
FIG. 24 shows calcium thin film optical transmission tests at 20° C. and 60% relative humidity (RH). Transmission is plotted as a function of time for a Ca film encapsulated with Cytop™-spacer-(PET(27 μm)/(thiol-ene/PET(27 μm))*3 (run A) and Cytop™-spacer-(PET(27 μm)/(thiol-ene/PET(27 μm))*3-spacer—(PET(27 μm)/(thiol-ene/PET(27 μm))*3 (run B).

FIG. 21 shows the structures for Ca films encapsulated with Cytop/epoxy/(PET(27 μm)/thiol-ene/PET(27 μm)/thiol-ene/PET(27 μm)/thiol-ene/PET(27 μm) (run A in FIG. 24) and Cytop/epoxy/(PET(27 μm)/TiO$_2$/thiol-ene/TiO$_2$/PET(27 μm)/thiol-ene/PET(27 μm)/TiO$_2$/thiol-ene/TiO$_2$/PET(27 μm) (run B in FIG. 24). E is an encapsulating epoxy.

Figure 22:
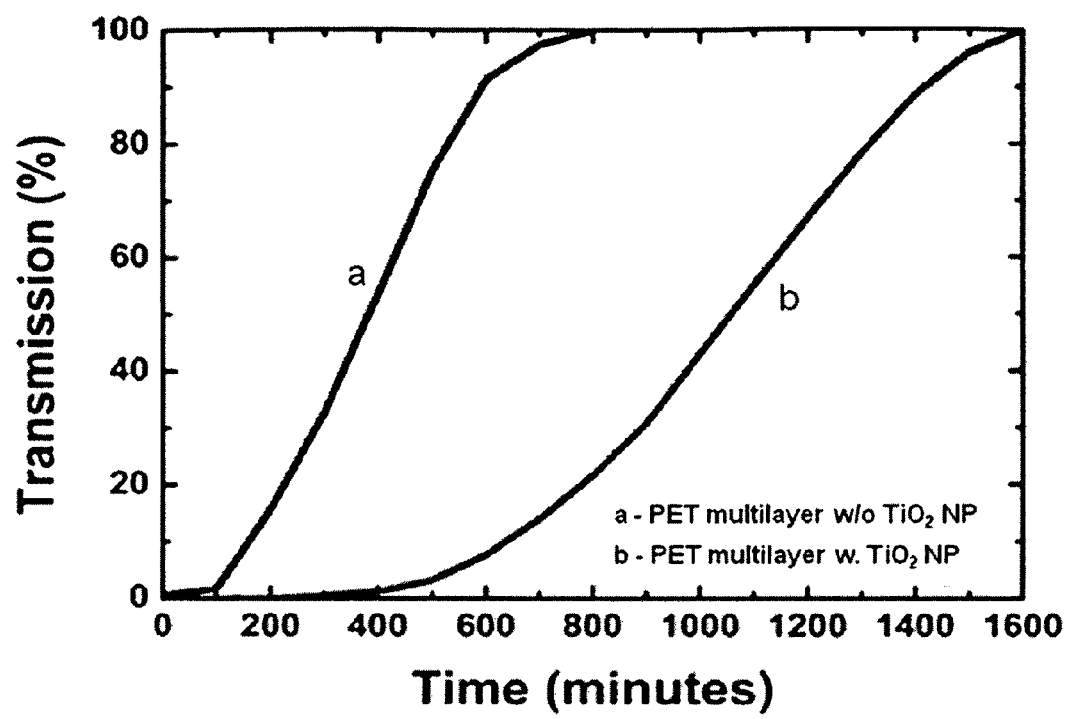
FIG. 22 shows calcium thin film optical transmission tests at 20° C. and 60% relative humidity (RH). Transmission is plotted as a function of time for a Ca film encapsulated with Cytop™-spacer-(PET(27 μm)/(thiol-ene/PET(27 μm))*3 (run A) and Cytop™-spacer—(PET(27 μm)/TiO$_2$/(thiol-ene/TiO$_2$/PET(27 μm))*3 (run B).

FIG. 22 shows transmission vs. time for Cytop/epoxy/(PET(27 μm)/thiol-ene/PET(27 μm)/thiol-ene/PET(27 μm)/thiol-ene/PET(27 μm) (run A) and Cytop/epoxy/(PET(27 μm)/TiO$_2$/thiol-ene/TiO$_2$/PET(27 μm)/thiol-ene/PET(27 μm)/TiO$_2$/thiol-ene/TiO$_2$/PET(27 μm) (run B). The temperature was 20° C. and the relative humidity was 60% for all of the runs in this study. The addition of the TiO$_2$ nanoparticles resulted in 2× longer Ca lifetime, which may be attributed to the fact that the TiO$_2$ nanoparticles absorb significant amounts of light gases.[10f]

Figure 23:
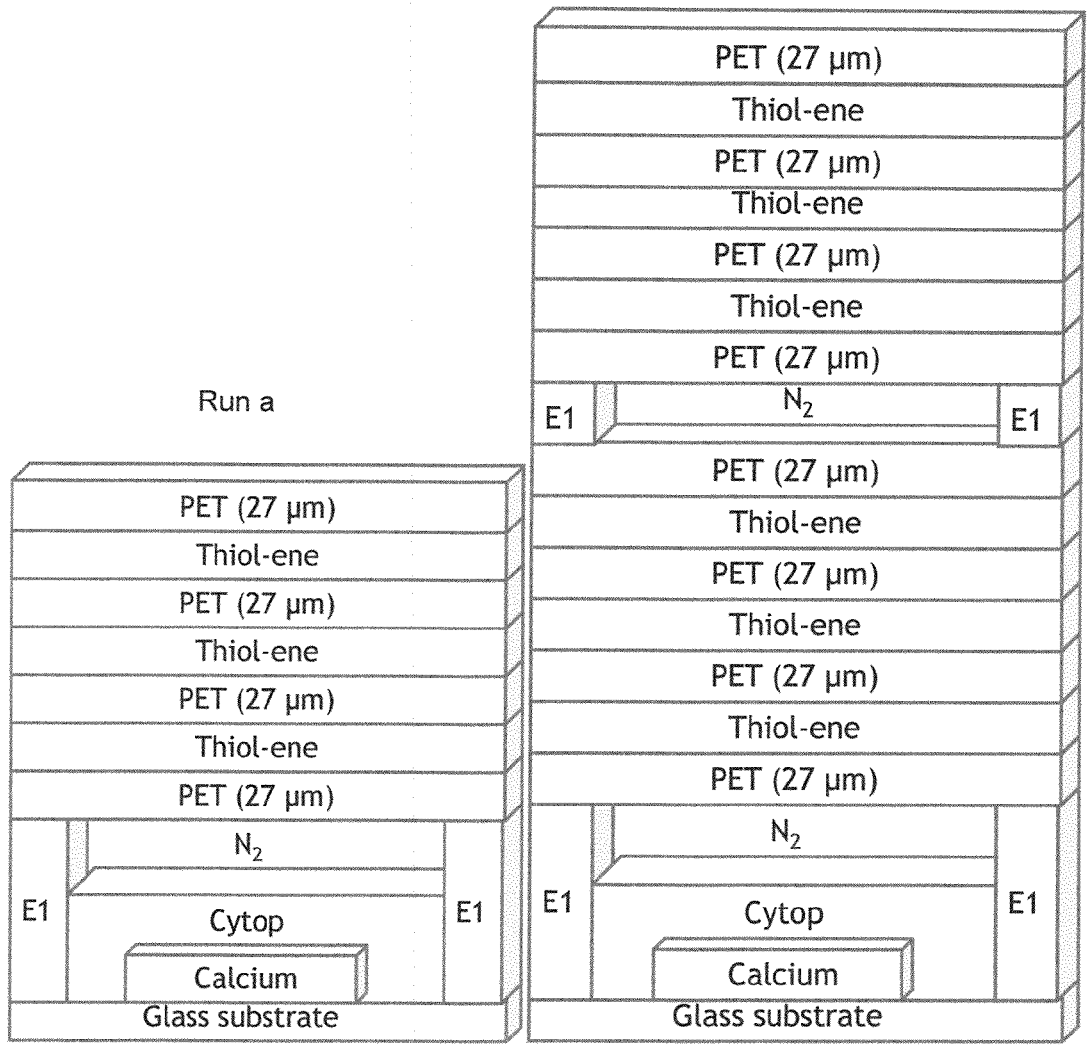
FIG. 23 shows the encapsulation architectures corresponding to run A and run B in FIG. 24.

FIG. 23 shows the structures for Ca films encapsulated with Cytop/epoxy/(PET(27 μm)/thiol-ene/PET(27 μm)/thiol-ene/PET(27 μm)/thiol-ene/PET(27 μm) (run A in FIG. 26) and Cytop/epoxy/(PET(27 μm)/thiol-ene/PET(27 μm)/thiol-ene/PET(27 μm)/thiol-ene/PET(27 μm)/epoxy/(PET(27 μm)/thiol-ene/PET(27 μm)/thiol-ene/PET(27 μm)/thiol-ene/PET(27 μm) (run B in FIG. 26). E is an encapsulating epoxy.

FIG. 24 shows transmission vs. time for Cytop/epoxy/(PET(27 μm)/thiol-ene/PET(27 μm)/thiol-ene/PET(27 μm)/thiol-ene/PET(27 μm) (run A) and Cytop/epoxy/(PET(27 μm)/thiol-ene/PET(27 μm)/thiol-ene/PET(27 μm)/thiol-ene/PET(27 μm)/epoxy/(PET(27 μm)/(run B). The addition of a nitrogen spacer between the two identical multi-layers for run B results in almost 3× improvement of the barrier properties and a substantial delay in the transient regime.

EXAMPLES

Materials

Poly(ethylene terephthalate) (PET) and poly(imide) (PI) were used a standard base films. These represent 'low-cost' free-standing barrier films. Other 'low-cost' free-standing barrier films that could be used in the architecture with gas spacers are Poly(ethylene naphthalate) (PEN), Kapton™, Polycarbonate (PC) and Poly(ethersulphone) (PES), and product offerings from Mitsubishi such as XBarrier™ and View Barrier™ and Techbarrier™. These 'low-cost' free-standing barriers have water vapor transmission rates (WVTRs) of between 10$^{-4}$ and 1000 g/m$^2$/day and oxygen transmission rates (OTRs) between 10$^{-2}$ and 1000 cm$^3$/m$^2$/day/atm However, in other embodiments barriers with WVTRs lower than 10$^{-4}$ g/m$^2$/day and OTRs between 10$^{-2}$ cm$^3$/m$^2$/day/atm can also be used. Any combination of two 'low-cost' free-standing commercial barriers can be used in the architecture with the gas spacer, as long as the combination of the two free-standing commercial barriers fulfill the encapsulation requirements with regards to cost and physical properties, e.g. permeability, transparency etc.

Inert gases that can comprise the spacer layer include, but are not limited to, argon, nitrogen, carbon-dioxide, neon, xenon, krypton, radon, helium, fluorocarbons, including a binary or ternary combination of the aforementioned gases. Any combination of two or more of these gases can also be used.

Barriers can comprise of organic compounds that include, but are not limited to, compounds that can be formulated to produce UV-curable, heat curable and thermo resins. UV-curable compounds can be formulated from, but are not limited to, acrylates, methacrylates and mercaptan[11,12] monomers, oligomers and polymers[13a,b]. The UV curable monomers and oligomer formulations can be mono, di, tri or tetra functional with respect to the cross-linking group. Heat curable formulations can be, but not limited to, acrylates, methacrylates and mercaptan monomers, oligomers and polymers. The heat curable monomer and oligomer formulations can be mono, di, tri or tetra functional with respect to the cross-linking group. One or two part thermoset resins can be used.

Barriers can also be comprised of inorganic compounds that include, but are not limited to, crystalline, polycrystalline or amorphous compounds such as $SiO_2$—$Al_2O_3$, $TiO_x$, $ZrO_x$, CeO, ZnO, $W_xO_y$, $Y_xO_y$, SrO, $SiO_x$, $Al_xO_y$ where x and y denotes the metal's oxidation state. One can produce any binary, ternary or quaternary alloy of the said compounds.

Barriers can also comprise of mixed organic/inorganic compounds, such as, but not limited to, organically modified ceramics (ORMOCER), ceramic polymers (CERAMER), and hybrid glass. The organic constituent can be a homopolymer, co-polymer, block-co-polymer, graft co-polymer. The inorganic constituent can consists of binary, ternary or quaternary metal oxide, sulfide, nitride, selenide or phosphide network. The organic and inorganic constituents can be blended to form an interpenetrating network or semi-interpenetrating network of organic/inorganic matrices. Copolymers consist of siloxane-urethane, siloxane-urea, siloxane-carbonate, siloxane-ester, siloxane-amide, siloxane-imide, siloxane-alkylene oxide and siloxane-sulfone.

TABLE 1

Representative materials used in the formulation of elastomeric layers (passive barriers) between hybridized sol-gel glass (active barriers).

| Compound | Supplier | Product Number | Use |
| --- | --- | --- | --- |
| Aliphatic allyl oligomer | Sartomer | CN9101 | Ene component of thiol-ene resin formulation used for heat resistance and adhesion |
| Aliphatic allyl urethane | Sartmer | CN9102 | Ene component of thiol-ene resin formulation used for heat resistance and adhesion |
| Urathane acrylate | Sartomer | CN991 | Ene component of thiol-ene resin formulation used for heat resistance and adhesion |
| Aliphatic urethane acrylate | Sartomer | CN996 | Ene component of thiol-ene resin formulation used for heat resistance and adhesion |
| (MERCAPTOPROPYL)METHYLSILOXANE HOMOPOLYMER | Gelest | SMS-992 | Thiol component of thiol-ene resin formulation used for cross-linking, mechanical strength and heat resistance |
| [4-6% (MERCAPTOPROPYL)METHYLSILOXANE]-DIMETHYLSILOXANE COPOLYMER | Gelest | SMS-042 | Thiol component of thiol-ene resin formulation used for cross-linking, mechanical strength and heat resistance |
| [2-3% (MERCAPTOPROPYL)METHYLSILOXANE]-DIMETHYLSILOXANE COPOLYMER | Gelest | SMS-022 | Thiol component of thiol-ene resin formulation used for cross-linking, mechanical strength and heat resistance |
| Two part addition cure silicone | Momentive Performance Materials | RTV-615 | Elastomeric adhesive between hybrid glass layers and top terminating layer for abrasion resistance and weatherability |
| Copolymer of tetrafluoroethylene and hydrocarbon olefins | Daikin USA | Zeffle GK | Elastomeric ashesive between fluorinated hybrid glass layers and top terminating layer for abrasion resistance and weatherability |

Representative, state of the art examples of inorganic/organic hybrid sol-gel resins (hybrid glass) were purchased from Hybrid Glass Technologies, Inc.

TABLE 2

Representative hybridized sol-gel resins from Hybrid Glass Technologies, Inc used to formulate solution deposited multilayer barrier films. The organic barrier thickness can be between 20 μm to 1 nm. The inorganic layer thickness can be between 10 μm to 1 nm.

| Compound | Identifier | Use |
|---|---|---|
| Heat curable hybrid of silica and polymer | HG-LIVD | Active/passive water barrier |
| Heat curable hybrid of fluorinated silica and polymer | HG-LIV | Active water barrier |
| Heat curable hybrid of silica and polymer | HG-LIM | Active water barrier |

The thickness of the (organic) barrier may also depend on the functionality/position of the (organic) barrier, that is, whether its primary function/position is that of a sorption, desorption or intermittent barrier between the sorption and desorption barriers. Both the sorption and desorption barriers are exposed to one or more gas(es), either in air (as the top sorption barrier of a multilayer structure) and/or in the gas-filled spacer (as the bottom desorption barrier or the top sorption barrier of a multilayer structure). If the primary function of the (organic) barrier is that of a sorption- or desorption barrier, then the thickness can be smaller, since sorption or desorption only occurs at the surface of the barrier.

Candidates for sorption barriers may include hydrophobic perfluorinated polymers, e.g. Cytop™, which can potentially be deposited as a thin film (10-100 nm) on the free-standing barrier film/substrate and still slow down permeation considerably due to slow sorption into the surface of the barrier film.

However, if the primary function of the barrier is that of an intermittent barrier, then thickness may be more important, since the time required for diffusion must be extended for this barrier. In this case, larger thicknesses may be beneficial, since diffusion time scales directly with the thickness of the barrier.

Composite barriers can be fabricated by dispersing nanoparticles into the bulk matrix to reduce free volume. The nanoparticles can be dispersed interstitially or chemically bound to the backbone of the matrix. Nanoparticles can include, but not limited to metallic (such as but not limited to Au, Ag, Pd, Ru, Rh, Ir, Pt, Ni, Re), oxide (such as but not limited to, $TiO_x$, $ZrO_x$, CeO, ZnO, $W_xO_y$, $Y_xO_y$, SrO, $SiO_x$, $Al_xO_y$ where x denotes the metal oxidation state) or semiconducting (such as but not limited to GaP, GaN, BN, AlN, AlP, ZnS, ZnO) nanocrystals.

In addition to nanoparticles, additives to elastomer resin to act as mechanical reinforcers or plasticizers can be used, such as but not limited to, ground glass particles with sufficiently small particle size to minimize light scattering, glass beads from sub micron to micron diameter, nanoparticle ensembles of spheres, rods, cubes, tubes and discs consisting of grapheme, carbon, group II-VI and III-V semiconductors, crystalline, polycrystalline and amorphous metal oxides of various oxidation states and noble metal groups.

Anti-plasticizers can also be used to reduce the free volume of the barrier matrix[14a-c]. The solubility parameter should be similar to the barrier matrix to enable a free volume reduction (and consequently a permeability reduction) of the barrier matrix. The literature suggests that antiplasticizers are compounds which are compatible with the polymer (similar solubility parameter) and which may (1) contain polar atoms such as halogen, nitrogen, oxygen, or sulfur (2) have at least two nonbridged rings (3) have a glass transition temperature greater than −50° C. (4) have one dimension less than 5.5 Å, in at least 65% of the length of the molecules. Such antiplasticizers include, but are not limited to additives which are thin, polar, stiff molecules. Antiplasticizing additives are specific for each polymer, and the same additive can work as a plasticizer for a polymer and an antiplasticizer for a different polymer. A few examples of additives which may work as antiplasticizers in certain polymer barriers are hexafluorobisphenol, N-phenyl-2-naphta, chlorinated biphenyl, Arochlor 5460, Arochlor 5442, N-phenyl-naphtylamine.

Electronic devices that can incorporate architectures described herein are, but not limited to, organic light-emitting diode (OLED), an organic photovoltaic (OPV) cells, inorganic photovoltaic cells such copper indium gallium sulfide (CIGS), copper indium gallium selenide (CIGSe), amorphous and polycrystalline silicon photovoltaic cells, organic field-effect transistors (OFETs), thin-film transistor (TFT) and liquid crystal display (LCD).

Solution deposition methods that can be used herein are, but not limited to, spin coating, dip coating, printing, roll to roll (e.g. gravure printing), doctor blade and electrostatic spray methods.

The organic and hybrid barriers can be deposited initially as uncured or partially cured. Partial curing of organic barrier layers can be performed to promote superior chemical bonding after successive layers has been deposited by allowing interfacial penetration of the respective material. Once successive layers have been deposited, final curing and annealing is carried out.

Functionalized films by corona or chemically treated surfaces were preferred for optimum adhesion. Stock film thickness ranged between 27 and 100 microns. All films were cleaned with ethanol and dried with nitrogen in a class III clean bench.

The hybridized organic/inorganic sol-gel resins (referred to as spin-on glass) were provided by Hybrid Glass Technologies Inc. The major constituent element in the samples consists of silicon dioxide. From this base inorganic network, the resin is hereafter classified into two families based on the chemical nature of the organic constituent elements, non-fluorinated and fluorinated. In most examples a resin was diluted with ethanol to approximately 1:1 by volume. Once the wet film is deposited curing proceeds by polycondensation. To ensure complete polycondensation, heat was applied up to 250° C. for a predetermined period of time.

Epoxy resins can be used for bonding and sealing nitrogen spacer regions. Ideal epoxies for this purpose show outgassing less than 0.8% below 200° C., viscosity range between 10 and 100,000 cPs, more preferable, 100 and 50,000 cPs, and most preferable between 500 and 15,000 cPs multicomponent mixtures; more preferable two part epoxies, most preferable single part epoxies, which cure by heat or more preferably by light (most preferably light in the wavelength region between 250 nm and 410 nm). General purpose epoxies can be used but due to high water vapor transmission rates it is more preferable to use epoxy resins with solid particles to reduce free volume and most preferable to use epoxies blended with water getters to minimize the propensity for edge ingress. Procurement cost increases for these epoxies as water vapor transmission rates decrease below 20 $g/m^2 day$ (at 60° C./90% relative humidity). These higher cost resins are blends with solid particle fillers such as clay and/or metal oxide water getters like barium oxide, phosphorous pentoxide, aluminum oxide, boron oxide, titanium dioxide just to name a few.

PDMS based thiol-ene elastomer resins were formulated to target specific physical properties such as enhanced adhesion on glass and plastic, wetting of plastic and glass surfaces, very high temperature resistance and rapid ambient photocuring. Depending on the specific physical property of interest, poly[(3-mercaptopropyl)methylsiloxane] was mixed with various cross-linking agents. The thiol to ene mol ratio was optimized for both hardness and wetting of various substrates. For example, cross-linking with an aliphatic allyl urethane is exceptional for very high temperature resistance and adhesion. Triallyl cyanurate and triallyl isocyanurate are effective for enhanced adhesion on glass, plastic and metal substrates. The ene to thiol mol ratio range $3>x>0.1$ is desirable. The range of $2.2>x>0.5$ is more desirable. The range $1.6>x>1.2$ is most desirable. All thiol-ene cross-linking was photoinitiated by mixing the respective resin with less than 0.01 wt % 2,2-dimethoxy-2-phenylacetophenone and exposure to 365 nm light source. Resins were diluted with alcoholic solvents depending on the desired film thickness and method of deposition.

A fluorinated PDMS based elastomer, provided by Daikin USA, was used for enhanced adhesion and wetting of fluorinated spin-on glass surfaces. After film deposition, curing proceeds by polycondensation. Heat was applied up to 100 C for less than 10 minutes to enhance the rate of polycondensation and to ensure complete cure.

Coating

Example 1

A multi-structure consisting of two pairs of a free-standing flexible barrier film, e.g. PET, and epoxy were assembled using a UV-laser to attach PET/epoxy to the underlying flat substrate or PET/epoxy pair. The PET films were cut into sizes ranging from 1.5×1.5 cm to 2.3×2.3 cm. The epoxy was deposited around the edges of the PET film, defining an epoxy seal to virtually eliminate permeation of $O_2$ and $H_2O$ through the edges of the PET/epoxy structure. The epoxy seal was cured for 20 seconds for each cm along the PET/epoxy seal. A second PET/epoxy structure was deposited directly on the first PET/epoxy structure.

Example 2

A multi-structure consisting of two pairs of a free-standing flexible barrier film, e.g. PET, and epoxy were assembled using a UV-laser to attach PET/epoxy to the underlying rigid substrate with elevated edges. The PET films were cut into sizes ranging from 1.5×1.5 cm to 2.3×2.3 cm. The epoxy was deposited around the edges of the PET film, defining an epoxy seal to virtually eliminate permeation of $O_2$ and $H_2O$ through the edges of the PET/epoxy structure. The epoxy seal was cured for 20 seconds for each cm along the PET/epoxy seal. A first PET/epoxy structure was deposited in the middle of the substrate, while the second PET/epoxy structure was deposited around the edges of the substrate.

Example 3

A multilayer consisting of alternating spin-on glass containing non-fluorinated silica and thiol-ene elastomer was prepared by spin coating. Test grade silicon wafers were scribed into sizes ranging from 1 cm×1 cm to 10 cm×10 cm. PET was fixed to the wafer surface by photocurable, low tack resin. Low tack resin was used so that no adhesive residue remained on the PET after peeling from the wafer. First, a layer of spin-on glass containing non-fluorinated silica was spin coated at 2000rpm for 30 seconds, followed by 3000rpm for 45 seconds. The glass was cured under an IR heat lamp for 12 hours at 60° C. The cured sol-gel layer was then corona treated to enhance wetting and adhesion between the proceeding thiol-ene polymer layer. Next, a thiol-ene resin consisting of poly[(3-mercaptopropyl)methylsiloxane] and aliphatic allyl urethane was diluted 1:1 by weight with ethylacetate. The resin was spin coated at 2000 rpm for 30 seconds. The sample was then cured under a 365 nm emission UV lamp at 275 mW/cm$^2$ for 1 minute. The cured thiol-ene polymer layer was thermally annealed under an IR heat lamp for 12 hours at 60° C. A second layer of the spin-on glass containing non-fluorinated silica, original stock solution, was spin coated on top of the thiol-ene polymer film at 700 rpm for 30 seconds. The film was thermally cured under an IR heat lamp for 12 hours at 60° C., followed by a corona treatment for 1 minute. A terminating layer of thiol-ene resin was spin coated on top of the glass layer at 2000 rpm for 30 seconds. The film was cured under UV emission for 1 minute, followed by a thermal anneal for 12 hours at 60° C.

Example 4

A multilayer consisting of alternating spin-on glass containing fluorinated silica and thiol-ene elastomer was prepared by spin coating. Test grade silicon wafers were scribed into sizes ranging from 1 cm×1 cm to 10 cm×10 cm. PET was fixed to the wafer surface by photocurable, low tack resin. Low tack resin was used so that no adhesive residue remained on the PET after peeling from the wafer. First, a layer of spin-on glass containing fluorinated silica was spin coated at 2000 rpm for 30 seconds, followed by 3000 rpm for 45 seconds. The glass was cured under an IR heat lamp for 12 hours at 40-50° C. The cured sol-gel layer was then corona treated to enhance wetting and adhesion between the proceeding thiol-ene polymer layer. Next, a thiol-ene resin consisting of poly[(3-mercaptopropyl)methylsiloxane] and aliphatic allyl urethane was diluted 1:1 by weight with ethylacetate. The resin was spin coated at 2000 rpm for 30 seconds. The sample was then cured under a 365 nm emission UV lamp at 275 mW/cm$^2$ for 1 minute. The cured thiol-ene polymer layer was thermally annealed under an IR heat lamp for 12 hours at 60° C. A second layer of the spin-on glass containing fluorinated silica, original stock solution, was spin coated on top of the thiol-ene polymer film at 700 rpm for 30 seconds. The film was thermally cured under an IR heat lamp for 12 hours at 40-50° C., followed by a corona treatment for 1 minute. A terminating layer of thiol-ene resin was spin coated on top of the glass layer at 2000 rpm for 30 seconds. The film was cured under UV emission for 1 minute, followed by a thermal anneal for 12 hours at 60° C.

Example 5

Wire bar coating was used for large area deposition up to A4 size. A poly(ethylene terephthalate) film, size A4, was placed on a vacuum plate. A slight vacuum was applied to the PET to ensure a flat and stable substrate. A 50wt % solution of non-fluorinated spin-on glass resin in ethanol was drawn with a wire bar. The wet film was then cured with a remote IR source for 12 hours at 60° C. The cured glass layer was then corona treated for about 1 minute for enhanced adhesion between the proceeding thiol-ene elastomeric layers. A 50wt % thiol-ene resin in ethyl acetate was drawn on top of the glass film using a wire bar. The thiol-ene polymer film was cured under a 365 nm emission source at 275 mW/cm$^2$ for 1 minute. The cured thiol-ene polymer layer was thermally annealed under an IR heat lamp for 12 hours at 60° C. These two layers represent one dyad. This process was repeated two more times for a total of three dyads or six films.

Example 6

Wire bar coating was used for large area deposition up to A4 size. A poly(ethylene terephthalate) film, size A4, was placed on a vacuum plate. A slight vacuum was applied to the PET to ensure a flat and stable substrate. A 50wt % solution of fluorinated spin-on glass resin in ethanol was drawn with a wire bar. The wet film was then cured with a remote IR source for 12 hours at 40-50° C. The cured glass layer was then corona treated for about 1 minute for enhanced adhesion between the proceeding thiol-ene elastomeric layers. A 50wt % thiol-ene resin in ethyl acetate was drawn on top of the glass film using a wire bar. The thiol-ene polymer film was cured under a 365 nm emission source at 275 mW/cm² for 1 minute. The cured thiol-ene polymer layer was thermally annealed under an IR heat lamp for 12 hours at 60° C. These two layers represent one dyad. This process was repeated two more times for a total of three dyads or six films.

REFERENCES

1. *Science,* 2002, Vol. 296, no. 5567, pp. 519-522.
2. J. G. Wijmans, R. W. Baker, Journal of Membrane Science 107 (1995), 1-21.
3. J. Granstrom, J. S. Swensen, J. S. Moon, G. Rowell, J. Yuen and A. J. Heeger, *Encapsulation of organic light-emitting devices using a perfluorinated polymer,* Appl. Phys. Lett., 2008, 93, 193304.
4. (A) Lange, J., Wyser, Y.; Recent innovations in barrier technologies for plastic packaging—a review, *Packaging Technology and Science,* volume 16, issue 4, 149-158, 2003.
   (B) Haas, K. H.; Hybrid Inorganic-Organic Polymers Based on Organically Modified Si-Alkoxides, *Advanced Engineering Materials,* volume 2, issue 9, 571-582, 2000.
5. Wen, J., Wilkes, G. L.; Organic/Inorganic Hybrid Network Materials by the Sol-Gel Approach, *Chemistry of Materials,* volume 8, issue 8, 1667-1681, 1996.
6. Wojcik A. B., Schuster K., Kobelke J., Michels C., Rose K., Matthewson M. J.; Novel Hybrid Glass Protective Coatings for High Temperature Applications, Proc. 54th Int. Wire & Cable Symp, 2005.
7. (A) G. L. Graff, R. E. Williford, P. E. Burrows, *Mechanisms of vapor permeation through multi-layer barrier films: lag time versus equilibrium permeation,* J. Appl. Phys. 96: 1840.
   (B) THREE DIMENSIONAL MULTILAYER BARRIER AND METHOD OF MAKING, WO2008094352A1
   (C) MULTILAYER BARRIER STACKS AND METHODS OF MAKING MULTILAYER BARRIER STACKS, US2007281174A1
   (D) METHOD FOR EDGE SEALING BARRIER FILMS, U.S. Pat. No. 7,198,832
8. 
   (A) GAS BARRIER FILM AND GAS BARRIER LAMINATE, US2008254266A1
   (B) GAS BARRIER MULTILAYER FILM, EP1941993A1
   (C) LAMINATED FILM HAVING GAS BARRIER CHARACTERISTICS, EP1927465A1
   (D) GAS BARRIER FILM LAMINATE, WO2008059925A1
   (E) GAS BARRIER FILM, EP1688246A4
   (F) GAS-BARRIER MATERIAL, U.S. Pat. No. 7,288,315
   (G) GAS BARRIER LAMINATE, WO02007119825A1
   (H) GAS BARRIER FILM AND GAS BARRIER LAMINATE, EP1712349A1
   (I) GAS BARRIER MULTILAYER BODY, EP1650020A1
9. S. Sourirajan, Reverse Osmosis, Academic Press, New York, 1970.
10. F. W. Greenlaw, W. D. Prince, R. A. Prince and E. V. Thompson, The effect of diffusive permeation rates by upstream and downstream pressures, J. Membrane Sci., 2 (1977) 141.
10*a* S. Kanehashi et al, Journal of Membrane Science, 253, 117-138 (2005).
10*b* Y. Tsujita et al, Prog. Polym. Sci. 28, 1377-1401 (2003).
10*c* F. Gouanve et al, European Polymer Journal, 43, 586-598 (2007).
10*d* Nisato, G. et al, Evaluating high performance diffusion barriers: the calcium test, Proc. Int. Display Workshop/Asia Display, (2001), 1435.
10*e*) J. A. Hauch, P. Schilinsky, S. A. Choulis, R. Childers, M. Biele, C. J. Brabec, Sol. Energy and Mater. Sol. Cells 92 (2008) 727.
10*f*. Matteucci, S.; Kusuma, V. A.; Swinnea, S.; Freeman, B. D., Gas permeability and diffusivity in 1,2-polybutadiene containing brookite nanoparticles, Polymer, 49, 3, 757 (2008).
11. Campos, L., Killops, K., Sakai, R., Paulusse, J. M., Damiron, D., Drockenmuller, E., Messmore, B., Hawker, C. J; Development of thermal and photochemical strategies for thiol-ene click polymer functionalization, *Macromolecules,* volume 41, issue 19, 7063-7070, 2008.
12. Hoyle, C. E., Lee, T. Y., Roper, T.; Thiol-enes: Chemistry of the past with promise for the future, *Journal of polymer science part A: Polymer Chemistry,* volume 42, issue 21, 5301-5338, 2004.
13. (A) Matthew M. Ellison, Devdatt S. Nagvekar, Eric G. Spencer, Paul E. Snowhite, Ultra-thin thiol-ene coatings WO2006055409A2.
    (B) Craig J. Hawker, Luis M. Campos, I. Meinel, Thiol-ene based poly(akylsiloxane)materials Ser. No. 12/250,344.
14. (A) W. J. Jackson JR, J. R. Caldwell; Antiplasticization. II. Characteristics of Antiplasticizers, *Journal of Applied Polymer Science,* volume 11, 211-226, 1967
    (B) S. E. Vidotti, A. C. Chinellato, L. A. Pessan; Effects of antiplasticization on the thermal, volumetrics, and transport properties of polyethersulfone, *Journal of Applied Polymer Science,* volume 103, 2627, 2007.
    (C) L. M. Robeson; The effect of antiplasticization on the secondary loss transitions and permeability of polymers, volume 9, 277-281, 1969.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims.

The invention claimed is:
1. An article comprising:
a substrate,
a sample overlying the substrate,
a first barrier layer overlying the sample;
a second barrier layer overlying the first barrier layer; and
a spacer layer between the first and second barrier layers, wherein:

the spacer layer comprises at least one inert gas; and
the article comprises alternating multilayers of the first and second layer.

2. The article of claim 1, wherein the first layer or second layer is selected from a group consisting of glass or elastomer or polyester.

3. The article of claim 1, wherein the first layer comprises a hybridized spin-on glass and the second layer comprises PDMS based elastomers.

4. The article of claim 1, wherein the first and/or second barrier comprise one or more layers comprising compounds selected for sorption and/or desorption properties.

5. The article of claim 1, wherein the substrate has elevated edges.

6. The article of claim 1, wherein the sample is an electronic device selected from a group consisting of an organic light-emitting diode (OLED), and an organic photovoltaic (OPV) cell.

7. The article of claim 1, wherein the sample is a calcium film used for barrier performance evaluation.

8. The article of claim 1, wherein the inert gas is Argon (Ar) or Nitrogen (N).

9. The article of claim 1, wherein the first and second layer is selected from a group consisting of organic or inorganic compounds.

10. The article of claim 9, wherein the organic layer is between 20 microns to 1 nanometer in thickness.

11. The article of claim 9, wherein the inorganic layer is between 10 microns to 1 nanometer in thickness.

12. The article of claim 9, wherein the organic layer is at least 1 micron and the inorganic layer is 1 nanometer thick.

13. The article of claim 9, wherein the organic layer is partially cured.

14. The article of claim 1, wherein either the first or second barrier layer comprises nanoparticles.

15. The article of claim 14, wherein the nanoparticles are metallic, oxide and/or semiconducting nanocrystals.

16. The article of claim 1, wherein the article is fabricated by applying a layer of epoxy liquid around the edges of the first or second barrier layer.

17. The article of claim 16, further comprising one or more layers of epoxy liquid resin and first and/or second barrier layers.

18. The article of claim 17, wherein the one or more layers of epoxy liquid resin and first and/or second barrier layers form a Russian doll or conventional type of encapsulation architecture.

19. The article of claim 17, wherein each layer of epoxy seal comprises distinct epoxy liquid resins.

20. The article of claim 19, wherein the distinct types of epoxy resin have similar or different viscosities and/or permeabilities.

21. The article of claim 1 formed by solution deposition.

22. The article of claim 21, wherein solution deposition is performed under ambient pressures and temperatures.

23. The article of claim 21, wherein the solution deposition is selected from a group consisting of spin coating, dip coating, printing, roll to roll, doctor blade and electrostatic spray methods.

24. An article comprising:
a substrate,
a sample overlying the substrate,
a first barrier layer overlying the sample;
a second barrier layer overlying the first barrier layer; and
a spacer layer between the first and second barrier layers, wherein:
the spacer layer comprises at least one inert gas; and
the first layer comprises a hybridized sol-gel layer, and the second layer comprises a thiol-ene elastomeric buffer layer.

25. An article comprising:
a substrate,
a sample overlying the substrate,
a first barrier layer overlying the sample;
a second barrier layer overlying the first barrier layer; and
a spacer layer between the first and second barrier layers, wherein:
the spacer layer comprises at least one inert gas; and
the first layer comprises poly(ethylene terephthalate) and the second layer comprises poly(imide).

26. An article comprising:
a substrate,
a sample overlying the substrate,
a first barrier layer overlying the sample; and
a second barrier layer overlying the first barrier layer; and
a spacer layer between the first and second barrier layers, wherein the spacer layer comprises at least one inert gas;
wherein the first layer comprises a hybridized spin-on glass and the second layer comprises PDMS based elastomers.

27. An article comprising:
a substrate,
a sample overlying the substrate,
a first barrier layer overlying the sample;
a second barrier layer overlying the first barrier layer; and
a spacer layer between the first and second barrier layers, wherein:
the spacer layer comprises at least one inert gas; and
the first barrier layer is a desorption layer and the second barrier layer is a sorption barrier.

28. The article of claim 27, wherein the desorption layer is a thiol-ene elastomeric barrier layer and the sorption barrier is one of a hydrophobic material, hybridized sol-gel or glassy polymer.

29. An article comprising:
a substrate,
a sample overlying the substrate,
a desorption layer encapsulating the sample;
a sorption barrier layer encapsulating the desorption layer; and
a spacer layer between the desorption layer and the sorption barrier layer, wherein the spacer layer comprises an inert gas.

* * * * *